(12) United States Patent
Kodama et al.

(10) Patent No.: US 7,098,510 B2
(45) Date of Patent: Aug. 29, 2006

(54) MULTIFINGER-TYPE ELECTROSTATIC DISCHARGE PROTECTION ELEMENT

(75) Inventors: Noriyuki Kodama, Kanagawa (JP);
Koichi Sawahata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 57 days.

(21) Appl. No.: 10/896,006

(22) Filed: Jul. 22, 2004

(65) Prior Publication Data

US 2005/0029540 A1    Feb. 10, 2005

(30) Foreign Application Priority Data

Jul. 28, 2003  (JP) .............................. 2003-281380
Apr. 21, 2004  (JP) .............................. 2004-125546

(51) Int. Cl.
*H01L 23/62* (2006.01)

(52) U.S. Cl. ....................... 257/355; 257/356; 257/358; 257/360

(58) Field of Classification Search ................ 257/327, 257/337, 350, 355, 356, 358, 360
See application file for complete search history.

(56) References Cited

U.S. PATENT DOCUMENTS 5,450,267 A   9/1995 Diaz et al.
6,583,972 B1  6/2003 Verhaege et al.
2002/0033507 A1 * 3/2002 Verhaege et al. ........... 257/360

FOREIGN PATENT DOCUMENTS

JP    8-24183    3/1996
JP    3157614    2/2001

OTHER PUBLICATIONS

Tong Li, Ching-Han Tsai, Elyse Rosenbaum and Sung-Mo Kang, "Substrate resistance modeling and circuit-level stimulation of parasitic device coupling effects for CMOS I/O circuits under ESD stress", Electrical Overstress/Electrostatic Discharge Symposium Proceedings, 1998, Oct. 6-8, 1998, pp. 281-289.

Barth, J. et al, "TLP calibration, correlation, standards, and new techniques [ESD test]", Electrical Overstress/Electrostatic Discharge 'Symosium Proceedings 2000, 2000 pp. 85-96.

(Continued)

*Primary Examiner*—Thien F. Tran
(74) *Attorney, Agent, or Firm*—Young & Thompson

(57) ABSTRACT

A multifinger ESD protection element has between an input wiring to which a surge current is input and a reference-potential wiring, 2n-number (where n is a natural number of 2 or greater) of fingers $F_1$ to $F_{2n}$. A drain resistor $Rd_i$ (i=1 to 2n), NMOS transistor $T_i$ and source resistor $Rs_i$ are connected serially in each finger $F_i$ in the order mentioned. A single unit $U_j$ is constructed by two mutually adjacent fingers $F_{2j-1}$ and $F_{2j}$ (where j is a natural number of 1 to n). In each unit the source of one transistor is connected to the gate of the other transistor and the source of this other transistor is connected to the gate of the first-mentioned transistor. The source $S_{2j}$ of finger $F_{2j}$ is connected to the source $S_{2j+1}$ of the next unit $U_{n+1}$. The 2n-number of fingers are connected in the form of a ring.

13 Claims, 31 Drawing Sheets

OTHER PUBLICATIONS

Christian Russ, Karlheiz Bock, et al., "Non-Uniform Triggering of gg-nMOS Investigated by Combined Emission Microscopy and Transmission Line Pulsing", Electrical Overstress/Electrostatic Discharge Symposium Proceedings, 1998 pp. 177-186.

Kwang-hoon Oh, et al., Non-Uniform Bipolar Conduction in Single Finger NMOS Transistors and Implications for Deep Submicron ESD Design, IEEE 01CH37167.39$^{th}$ Annual International Reliability Ph7ysics Symposium, Orlando Florida, 2001 pp. 226-234.

* cited by examiner

US 7,098,510 B2

MULTIFINGER-TYPE ELECTROSTATIC DISCHARGE PROTECTION ELEMENT

FIELD OF THE INVENTION

This invention relates to a multifinger-type electrostatic discharge protection element formed in a semiconductor integrated circuit to protect the circuit elements from damage caused by electrostatic discharge. More particularly, the invention relates to a multifinger MOS-type electrostatic discharge protection element in which a plurality of fingers are connected in parallel with one another.

BACKGROUND OF THE INVENTION

An electrostatic discharge (ESD) protection element comprising diodes or resistance elements is used conventionally to protect the circuit elements in a semiconductor integrated circuit against ESD. Recently, ESD protection elements provided in a CMOS (Complementary Metal Oxide Semiconductor) integrated circuit have come to be replaced by MOS-type protection elements that utilize a parasitic bipolar operation and exhibit a lower resistance and a higher discharge capability than ESD protection elements comprising diodes or resistance elements. Such a MOS-type protection element is one that utilizes the snapback phenomenon of a MOSFET (MOS Field-Effect Transistor).

The ability to pass electric current is limited even in a MOS protection element that relies upon a parasitic bipolar device. In many cases protection performance will not meet the required level unless the width of the protection element is enlarged to 400 to 800 µm. In an integrated circuit, however, the arrangement of bonding pads usually imposes a limitation upon layout and often the MOS protection element must be made to fit in a stipulated area. For this reason, a method adopted in the art is to employ not a MOS protection element consisting of a single element but rather one having a plurality of small MOSFETs referred to as fingers having a width of 10 to 50 µm, arranging them in a direction (e.g., the horizontal direction) perpendicular to the direction of current flow, connecting them in parallel with one another and arranging the elements in the stipulated area in an efficient manner. To achieve this, one method is to commonly connect the sources and drains of the fingers to thereby connect the plurality of fingers in parallel with one another, and another method is to array small MOSFETs individually and connect them in parallel with one another (see Non-Patent Document 1, namely Tong Li, Ching-Han Tsai, Elyse Rosenbaum and Sung-Mo Kang, "Substrate resistance modeling and circuit-level stimulation of parasitic device coupling effects for CMOS I/O circuits under ESD stress", Electrical Overstress/Electrostatic Discharge Symposium Proceedings, 1998, 6–8 Oct. 1998, pp. 281–289).

FIG. 15 is a plan view illustrating an input protection element 101 that utilizes the snapback phenomenon of an NMOSFET, which is a conventional MOS-type projection element, FIG. 16 is a diagram illustrating a cross section taken along line A–A' in FIG. 15 as well as an equivalent circuit thereof, and FIG. 17 a graph illustrating the operating characteristic of this MOS-type protection element, in which voltage applied to the protection element is plotted along the horizontal axis and current that flows into the protection element is plotted along the vertical axis. In the MOS-type protection element 101, a plurality of gate electrodes 103 extending in one direction are provided in parallel above a P-type substrate 102, and regions directly underlying the gate electrodes 103 in the surface of the P-type substrate 102 serve as channel regions 104. The areas between the channel regions 104 in the surface of the P-type substrate 102 define source regions 105 or drain regions 106, and the source regions 105 and drain regions 106 are arrayed in alternating fashion.

As a result of this structure, a plurality of MOSFETs 111 are formed and the source regions or drain regions of mutually adjacent MOSFETs 111 are connected in common. A plurality of contacts 107 are arrayed in a single row on the surface of respective ones of the source regions 105 and drain regions 106 in a direction along which the gate electrodes 103 extend. A guard ring 108 comprising a heavily doped $p^+$ is provided in the surface of the P-type substrate 102 so as to surround the plurality of MOSFETs 111 and is connected to a ground wiring 109. The guard ring 108 is provided for the purpose of preventing latch-up. An input pad 110 is connected to the contact 107 formed on the surface of the drain region 106.

Referring to FIGS. 15 to 17, the operation of the MOS protection element 101 is described. When a surge current enters the input pad 110, the surge current flows into the drain region 106 via the contact 107, thereby raising the drain voltage. If the drain voltage exceeds the voltage indicated at Vt0 in FIG. 17, avalanche breakdown begins at the PN junction between the drain region 106 and channel region 104 and a substrate current flows. At this time a parasitic bipolar transistor is formed in which the source region 105 of each finger is the emitter, the P-type substrate 102, inclusive of the guard ring 108, is the base and the drain region 106 is the collector. Owing to the current that flows through the interior of the P-type substrate 102, a potential difference corresponding to the product of this current and the resistance of the P-type substrate 102 is produced in the P-type substrate 102 and the potential in the vicinity of the bottom surface of the source region 105 in the P-type substrate 102 rises relative to the guard ring 108. When the voltage applied to the MOS protection element 101 reaches Vt1, as shown in FIG. 17, the potential in the vicinity of the bottom surface of the source region 105 relative to the guard ring 108 becomes large enough, e.g., 0.7 V, to forward bias the PN junction between the source region 105 and channel region 104. The PN junction thus is forward-biased, a further current flows and a state of low resistance is obtained owing to conduction of the parasitic bipolar transistor. As a result, a larger current flows. This phenomenon is referred to as snapback, and the voltage Vt1 is referred to as snapback starting voltage or trigger voltage.

If it is attempted to perform an I-V measurement of the kind shown in FIG. 17 by means of an ordinary current-voltage measuring apparatus, measurement requires application of current for an extended period of time. Consequently, the DUT (Device Under Test) will be destroyed before the snapback state is attained. To measure the snapback phenomenon, therefore, usually a measurement apparatus referred to as a TLP (Transmission Line Pulser) is employed. This apparatus subjects the DUT to a rectangular current waveform having a duration on the order of 100 ns and reads the values of current and voltage of the DUT from a change in the voltage and current thereof. (By way of example, see Non-Patent Document 2, namely Barth, J. et al, "TLP calibration, correlation, standards, and new techniques [ESD test]", Electrical Overstress/Electrostatic Discharge Symposium Proceedings 2000, 2000 pp. 85–96.) In general, V=It2×1500 has been experimentally determined to be the relationship between breakdown current It2 [A] of a DUT measured with a TLP and breakdown voltage V [V] of the DUT measured by a human body model (HBM) test.

Non-Patent Document 3 (Christian Russ, Karlheinz Bock, et al., "Non-Uniform Triggering of gg-nMOSt Investigated by Combined Emission Microscopy and Transmission Line Pulsing", Electrical Overstress/Electrostatic Discharge Symposium Proceedings, 1998 pp. 177–186) states that since avalanche current is highly dependent upon the electric field applied to a PN junction, there is a high probability that snapback will occur in a MOS transistor from a corner where the electric field is strongest.

Further, Non-Patent Document 4 (Kwang-hoon Oh, et al., "Non-Uniform Bipolar Conduction in Single Finger NMOS Transistors and Implications for Deep Submicron ESD Design", IEEE 01CH37167.39$^{th}$ Annual International Reliability Physics Symposium, Orlando, Fla., 2001 pp. 226–234) reports that in a process that uses a low-resistance substrate, there are instances where snapback occurs locally at random locations in a finger owing to statistical variations in the process.

In a single-finger protection element, as described above, a problem is that the element tends to be destroyed owing to current crowding. Further, there are instances where snapback voltage is too high and instances where breakdown occurs owing to application of excessive current to the element's own gate electrode. The inventions described in Patent Documents 3 and 4 (Japanese Patent No. 3157614 and Japanese Patent Kokoku Publication No. JP-B-8-24183, respectively) are inventions relating to such cases.

In Patent Document 3, as shown in FIG. 30, the impurity-doped region of a source area is provided with a resistor, and a gate electrode is connected to ground potential via this resistor, thereby preventing an excessive voltage from being impressed upon the gate voltage of the transistor.

As shown in FIG. 31, Patent Document 4 describes a structure in which the occurrence of electrostatic breakdown is prevented by forming notches in both sides of a source to thereby provide resistance and lowering the peak voltage of electrostatic stress at the boundary points between a field oxide film, gate electrode and source region or drain region where an electric field ascribable to application of static electricity tends to occur.

A MOS-type protection element comprising a plurality of fingers (namely a multifinger-type protection element) has the following problem: In multifingers, operation differs from finger to finger. This difference in operation can be explained as being ascribable to a difference in substrate resistance. More specifically, since the distance to the ground electrode (usually the guard ring) as seen from each finger differs, the substrate resistances, namely the base resistances of the parasitic bipolar transistors, differ from one another. As a result, owing to accumulation of electric charge after avalanche breakdown, a difference develops in the local voltage formed at the junction region between the source region and channel region of each MOSFET. Accordingly, the timings at which the parasitic bipolar transistors reach the snapback voltage differ and the timings at which the parasitic bipolar transistors turns on differ. In actuality, as shown in FIGS. 15 and 16, substrate potential is coupled to the substrate currents of the fingers and the substrate resistance differs depending upon the three-dimensional current route in each finger and the lateral substrate resistances within the fingers. Thus, the causes that lead to a difference is substrate resistance between fingers include complicated factors.

If a current flows into the PN junction on the drain side of a finger, namely the PN junction between the drain and channel regions, the potential difference at this PN junction comprises the major part of the potential difference within the finger and heat is therefore produced, mainly in the region of the PN junction. There is a positive correlation between the current and the junction temperature; the higher the temperature, the greater the current. In other words, if current concentrates in some of the fingers owing to process variations and structure, or if there are statistical variations in contact resistance and drain resistance within a finger and current concentrates in a specific finger or in a specific area of a finger, then this will trigger the occurrence of positive feedback in which the PN junction of the finger in which current has concentrated or in the specific region of the finger evolves heat, thereby raising the temperature and producing a further increase in amount of current. The heated portion will eventually melt. Consequently, the finger turned on first breaks down before other fingers are turned on, meaning that the advantages of the multifinger structure are not exploited.

A technique in which a protection element is provided with a trigger circuit to turn on a parasitic bipolar transistor in the protection element reliably has been disclosed (see Patent Document 1, namely U.S. Pat. No. 5,450,267). FIG. 18 is an equivalent circuit diagram illustrating this conventional protection element disclosed in Patent Document 1. As shown in FIG. 18, the conventional protection element is such that a current control switch 122 is connected to an input pad 121 into which a surge current flows. Further, the current control switch 122 is provided with an NMOS transistor 123 having its drain and source connected to the input pad 121 and to a ground electrode, respectively. The protection element is provided with a trigger circuit 124 in addition to the current control switch 122. The trigger circuit 124 is provided with an NMOS transistor 125 having its drain and source connected to the input pad 121 and to the gate of the NMOS transistor 123, respectively. When a surge current enters the input pad 121 of this conventional protection element, first the NMOS transistor 125 of the trigger circuit 124 turns on to apply a positive voltage to the gate of the NMOS transistor 123.

When the gate potential of the NMOS transistor 123 rises, a current starts flowing into the NMOS transistor 123, whereby avalanche breakdown tends to occur uniformly across the channel region. An advantage, therefore, is that snapback begins at a lower voltage.

As a result, NMOS 123 does not evolve heat locally, an excessively high voltage is not produced, safe turn-on is achieved and the surge current that entered the input pad 121 flows to the ground electrode.

However, the prior art described above involves the following difficulty: If the technique described in Patent Document 1 is applied to a protection element having a multifinger structure, e.g., if a trigger circuit is connected independently to each of the individual protection elements (fingers), there is the possibility that a protection element (an individual finger) will snap back and be destroyed by current crowding unless the device employs an arrangement in which the trigger circuit operates first (the present invention, described later, is equipped with such an arrangement).

On the other hand, if just one trigger circuit is provided and this single trigger circuit is connected to all of the multiple fingers, then, when only a specific finger snaps back, current will concentrate in this finger and it will be destroyed in a manner similar to the above.

A conceivable method of solving this problem is to connect the source of each finger to the gate of the neighboring finger (see Patent Document 2, namely U.S. Pat. No. 6,583,972). FIG. 19 is an equivalent circuit illustrating a multifinger-type protection element described in Patent Document 2, and FIG. 20 is a graph illustrating the operating characteristic of this MOS-type protection element, in which the voltage applied to the protection element and the current that flows into the protection element are plotted along the horizontal and vertical axes, respectively. In this protection element, as illustrated in FIGS. 19 and 20, n-number (where n is a natural number of 2 or greater) of fingers $F_1$ to $F_n$ are connected in parallel with one another between an input pad 131, to which ESD is applied, and a ground electrode 132. In each finger $F_i$ (i=1 to n), a drain resistor $Rd_i$ (i=1 to n), NMOS transistor $T_i$ (i=1 to n) and source resistor $Rs_i$ (i=1 to n) are connected in series in order from the input pad 131 to the ground electrode 132. The source resistor $Rs_k$ in the finger $F_k$ [k=1 to (n−1)] is connected to the gate of NMOS transistor $T_{k+1}$ of the neighboring finger $F_{k+1}$. The source resistor $Rs_n$ of finger $F_n$ is connected to the gate of NMOS transistor $T_1$ of finger $F_1$. Thus, all of the fingers are connected into a ring-shaped configuration as a whole.

When finger $F_k$ snaps back, a current flows into source resistor $RS_k$ and a potential difference is produced. Since the intermediate point of the resistor $Rs_k$ is connected to the gate electrode of the neighboring finger $F_{k+1}$, the gate potential $G_{k+1}$ rises. Owing to the rise in gate potential, current begins to flow into the finger $F_{k+1}$. As a result, avalanche breakdown tends to occur uniformly across the channel region. This has the additional advantage of reducing the snapback voltage. Accordingly, the NMOS transistor $T_{k+1}$ of the neighboring finger $F_{k+1}$ turns on safely and finger $F_{k+1}$ snaps back. Owing to snapback of finger $F_{k+1}$, finger $F_{k+2}$ snaps back, and so on. When any single finger snaps back, all fingers snap back sequentially in a chain-like fashion. Thus, the method employed by this protection element is referred to as the "domino method" because all fingers snap back in a "domino effect" manner.

[Non-patent Document 1]
Tong Li, Ching-Han Tsai, Elyse Rosenbaum and Sung-Mo Kang, "Substrate resistance modeling and circuit-level stimulation of parasitic device coupling effects for CMOS I/O circuits under ESD stress", Electrical Overstress/Electrostatic Discharge Symposium Proceedings, 1998, 6–8 Oct. 1998, pp. 281–289

[Non-patent Document 2]
Barth, J. et al, "TLP calibration, correlation, standards, and new techniques [ESD test]", Electrical Overstress/Electrostatic Discharge Symposium Proceedings 2000, 2000 pp. 85–96

[Non-patent Document 3]
Christian Russ, Karlheinz Bock, et al., "Non-Uniform Triggering of gg-nMOSt Investigated by Combined Emission Microscopy and Transmission Line Pulsing", Electrical Overstress/Electrostatic Discharge Symposium Proceedings, 1998 pp. 177–186

[Non-patent Document 4]
Kwang-hoon Oh, et al., "Non-Uniform Bipolar Conduction in Single Finger NMOS Transistors and Implications for Deep Submicron ESD Design", IEEE 01CH37167.39[th] Annual International Reliability Physics Symposium, Orlando, Fla., 2001 pp. 226–234

[Patent Document 1]
U.S. Pat. No. 5,450,267

[Patent Document 2]
U.S. Pat. No. 6,583,972

[Patent Document 3]
Japanese Patent No. 3157614

[Patent Document 4]
Japanese Patent Kokoku Publication No. JP-B-8-24183

In a MOS-type ESD protection element, as described earlier, usually the parasitic bipolar state that occurs locally in each finger spreads to all fingers, whereby all fingers attain a state of low resistance and snap back. As a result, ESD current can be caused to discharge stably. However, in a case where the parasitic bipolar state does not spread to all fingers, current concentrates in the region that that snapped back first in the fingers and this finger may be destroyed.

In the above-mentioned domino-type multifinger ESD protection element (Patent Document 2), the finger that snaps back first exhibits a snapback operation different from that of the other fingers that snap back sequentially thereafter because this finger has a gate potential that is ground potential. More specifically, in the finger that snaps back first, the parasitic bipolar state occurs locally in a region where the electric field at the drain end is strong. At this time current flows from the drain to the source of this MOS transistor but the gate potential thereof remains at ground potential. In other words, the circuit arrangement is such that in the finger that snaps back first, the electric field at the PN junction of the drain end is stronger than that of the other fingers; if a current flows, this electric field is strengthened further. Consequently, the parasitic bipolar state that occurs at the drain end does not readily spread to the regions of the other fingers and often current concentrates in the region in which the parasitic bipolar state occurred first.

By contrast, in the other fingers that snap back sequentially thereafter, the fact that the gate potential is initially elevated means that the parasitic bipolar state will readily spread to all fingers and a channel current will tend to flow uniformly over the entire region of fingers. As a result, all fingers attain the parasitic bipolar state and snap back substantially simultaneously. Thus, in the domino-type multifinger ESD protection element described above, a problem is that the finger that snaps back first tends to be destroyed.

In order to solve this problem, a method in which the gates of all fingers are connected together also is conceivable. FIG. 21 is a circuit diagram illustrating a conventional protection element in which the gates have thus been connected in common. As shown in FIG. 21, the gates of all fingers $F_i$ (i=1 to n) of this conventional protection element are connected together and the respective sources of fingers are connected to the commonly connected gates via respective ones of diodes. As a result, when one finger has snapped back, the source potential of this finger rises, a voltage is applied to the gates of all fingers inclusive of this finger and all of the fingers snap back. With this method, however, there is an increase in the area of the layout because it is required that each finger be provided with a diode. Further, since all gates are interconnected, source potential is dispersed and eventually the highest electric potential is applied to the gate nearest the source whose potential has risen, namely the gate of the finger that has snapped back first. As a result, further current flows into the finger that snapped back first and current concentrates in this finger. In addition, in snapback of the other fingers, the fact that the operating speed of the diodes is slow means that the local current crowding in the finger that snapped back first cannot be suppressed and, hence, destruction of this finger cannot be prevented.

In a conventional multifinger MOS protection element having a shared source region (heavily doped $n^+$ region), the snapback state is attained substantially simultaneously, in which the potentials at the base/collector PN junctions of each of the parasitic bipolar transistors affect one another via the substrate (P wells) owing to low resistance (i.e., as a result of substrate coupling). However, with the domino-type multifinger ESD protection element (see Patent Document 2), the multiple fingers are all such that their elements are isolated, as a result of which resistance rises and the effect of substrate coupling is diminished. This represents a problem.

Further, with the domino-type multifinger ESD protection element (see Patent Document 2), the source regions are split and a resistance element is inserted between the split source regions. A problem which arises is a larger layout area.

Accordingly, an object of the present invention is to provide a multifinger ESD protection element of reduced layout area in which it is possible to prevent destruction of a finger that snaps back first.

SUMMARY OF THE DISCLOSURE

The above and other objects are attained by a multifinger ESD protection element, in accordance with a first aspect of the present invention, which has multiple fingers connected in parallel with one another between an input wiring to which a surge current is input and a reference-potential wiring to which a reference potential is applied, wherein the multiple fingers are grouped into first to nth (where n represents a natural number of 2 or greater) units of a plurality of fingers each; each finger includes a transistor having a drain connected to the input wiring and a source resistor having a first end connected to a source of the transistor and a second end connected to the reference-potential wiring; the source of this transistor is connected to a gate of a transistor in another finger belonging to the same unit as that of the finger to which the first-mentioned transistor belongs; sources of at least two transistors belonging to a first unit are connected to respective ones of a source of at least one transistor belonging to a second unit and a source of least one transistor belonging to the nth unit; sources of at least two transistors belonging to a kth [where k represents a natural number of 2 to (n−1)] unit are connected to respective ones of a source of at least one transistor belonging to a (k−1)th unit and a source of at least one transistor belonging to a (k+1)th unit; and sources of at least two transistors belonging to the nth unit are connected to respective ones of a source of at least one transistor belonging to the (n−1)th unit and a source of at least one transistor belonging to the first unit.

In the present invention, a surge voltage is impressed upon all fingers when a surge current enters the input wiring. When one finger initially snaps back, a current flows into the transistor and source resistor of this finger and the source potential of the transistor in this finger rises. Consequently, the gate potentials of the transistors in the other fingers belonging to the same unit as that of the finger that snapped back rise and these fingers snap back. The source potentials of these fingers therefore rise and so does the gate potential of the finger that snapped back first. As a result, in the finger that snapped back first, it is possible to inhibit current crowding in the region that attained the parasitic bipolar state first and destruction of this finger can be prevented. Further, the source potential of the finger that snapped back first is transferred to the source of a finger belonging to another unit. As a result, with the unit that snapped back first serving as a starting point, the other units snap back in chain-like fashion in forward and backward directions so that the fingers of all units snap back quickly. The surge current applied to the input wiring therefore flows into the reference-potential wiring via all fingers.

One finger in at least one of the units may be a drive element in which the output of a predriver circuit is applied to the gate of the transistor of this finger. This makes it possible to form the drive element and protection element at the same time. Further, multifinger ESD protection elements of a plurality of types in which the numbers of drive elements differ from one another can be formed according to the same design specifications.

According to a second aspect of the present invention, the foregoing object is attained by providing a multifinger ESD protection element having first to nth (where n represents a natural number of 2 or greater) fingers connected in parallel with one another between an input wiring to which a surge current is input and a reference-potential wiring to which a reference potential is applied, wherein each finger includes a transistor having a drain connected to the input wiring and a source resistor having a first end connected to a source of the transistor and a second end connected to the reference-potential wiring; a source of the transistor belonging to the first finger is connected to a gate of a transistor belonging to a second finger and to a source of a transistor belonging to the nth finger via a first source-to-source resistor; a source of a transistor belonging to a kth [where k represents a natural number of 2 to (n−1)] finger is connected to a gate of a transistor belonging to a (k+1)th finger and to a source of a transistor belonging to a (k−1)th finger via a kth source-to-source resistor; and the source of the transistor belonging to the nth finger is connected to a gate of the transistor belonging to the first finger and to a source of a transistor belonging to an (n−1)th finger via an nth source-to-source resistor.

The present invention according to this aspect is such that when a kth finger initially snaps back, the source potential of the kth finger rises, the potential rise is transferred to the gate of the (k+1)th finger and the (k+1)th finger snaps back. All fingers thus snap back sequentially in chain-like fashion. When the kth finger snaps back, the source potential of the (k−1)th finger rises and a positive potential is impressed upon the gate of the kth finger. Thus, in the ESD protection element according to the present invention, snapback of the fingers occurs in chain-like fashion in the forward and backward directions with the finger that snapped first serving as the starting point. As a result, the gate potential of the finger that snapped back first rises rapidly without waiting for the chain of snapbacks to make one full cycle.

According to a third aspect of the present invention, the foregoing object is attained by providing a multifinger ESD protection element having first to nth (where n represents a natural number of 2 or greater) fingers connected in parallel with one another between an input wiring to which a surge current is input and a reference-potential wiring to which a reference potential is applied, wherein each finger includes a transistor having a drain connected to the input wiring and a source resistor having a first end connected to a source of the transistor and a second end connected to the reference-potential wiring; m-number of fingers from (n−m+1)th [where represents a natural number of 1 to (n−2)] to nth fingers among the n-number of fingers from the first to the nth fingers are drive elements in which output of a predriver circuit is applied to gates of the transistors of these fingers; a source of a transistor belonging to a kth [where k represents a natural number of 1 to (n−m−1)] finger is connected to a gate of a transistor belonging to a (k+1)th finger; a source of a transistor belonging to an (n−m)th finger is connected to the gates of the transistors belonging to the (n−m+1)th to nth fingers; and sources of the transistors belonging to the (n−m+1)th to nth fingers are connected to the gate of the transistor belonging to the first finger.

In the present invention according to this aspect, the drive elements and the protection element can be formed simultaneously. Further, multifinger ESD protection elements of a plurality of types in which the numbers of drive elements differ from one another can be formed according to the same design specifications. Further, when any of the (n−m+1)th to nth fingers serving as the drive elements initially snaps back, the source potential of this finger rises and the rise in potential is transferred via the source of the (n−m+1)th finger to the gate of the finger that snapped back first. As a result, the gate potential of the finger that snapped back first rises rapidly. Further, the rise in the source potential of the finger that snapped back first is transferred to the gate of the first finger and the first finger snaps back. All fingers subsequently snap back sequentially in chain-like fashion. Consequently, surge current that has been applied to the input wiring flows into the reference-potential wiring via all fingers.

According to a fourth aspect of the present invention, the foregoing object is attained by providing a multifinger ESC protection element having first to nth (where n represents a natural number of 2 or greater) fingers connected in parallel with one another between an input wiring to which a surge current is input and a reference-potential wiring to which a reference potential is applied, wherein each finger includes a transistor having a drain connected to the input wiring, a source resistor having a first end connected to a source of the transistor and a second end connected to the reference-potential wiring, and positive-potential application means for applying a positive potential to a gate of the transistor belonging to the first finger when a surge current has entered the input wiring; and a source of a transistor belonging to a kth [where k represents a natural number of 1 to (n−1)] finger is connected to a gate of a transistor belonging to a (k+1)th finger.

In this aspect of the present invention, the positive-potential application means applies a positive potential to the gate of the transistor belonging to the first finger when a surge current enters the input wiring, as a result of which the first finger can always be made to snap back first. Since the positive high potential is applied to the gate of the transistor in the first finger, current flows into this finger uniformly and destruction of this finger can be prevented.

The positive-potential application means may include a capacitor having one electrode connected to the input wiring and another electrode connected to the gate of the transistor belonging to the first finger, and a resistor having one end connected to the gate of the transistor belonging to the first finger and another end connected to the reference-potential wiring, or a diode having an anode connected to the input wiring and a cathode connected to the gate of the transistor belonging to the first finger, and a resistor having one end connected to the gate of the transistor belonging to the first finger and another end connected to the reference-potential wiring.

According to a fifth aspect of the present invention, the foregoing object is attained by providing a multifinger ESD protection element having multiple fingers formed in the surface of a semiconductor substrate and connected in parallel with one another between an input wiring to which a surge current is input and a reference-potential wiring to which a reference potential is applied, wherein each finger includes a MOS transistor having a source and a drain comprising impurities doped regions formed in the surface of the semiconductor substrate, the drain being connected to the input wiring, and a source resistor having one end connected to the source of this transistor and another end connected to the reference-potential wiring; a source of a transistor belonging to a kth [where k represents a natural number of 1 to (n−1)] finger is connected to a gate of a transistor belonging to a (k+1)th finger; a source of a transistor belonging to an nth finger is connected to a gate of a transistor belonging to a first finger; a plurality of contacts and a plurality of taps are formed in the surface of the impurity-doped region that forms the source, the contacts being formed in the surface at both ends and at a central portion in a direction along which a boundary line of the impurity-doped region and a channel region extends and being connected to the gates of fingers that are different from the finger to which this source belongs, and the taps being disposed spaced away from the contacts in the direction along which the boundary line extends and being connected to the reference-potential wiring; and the source resistor is resistance of the impurity-doped region between the contacts and taps.

In this aspect of the present invention, the contacts are provided at both ends of the source region in the width direction and at the central portion thereof. In the initial stage of snapback, therefore, a change in the source potential of the finger can be picked up rapidly and transferred to the gate of another finger. Consequently, the speed of the chain reaction in which the fingers snap back sequentially rises and the gate potential of the finger that snapped back first can be made to rise quickly. As a result, the finger that snapped back first can be prevented from being destroyed by local current crowding.

Thus, in accordance with the present invention, the gate potential of a finger that snaps back first can be made to rise quickly when a surge current enters a multifinger ESD protection element. This makes it possible to prevent destruction of the finger that snapped back first.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
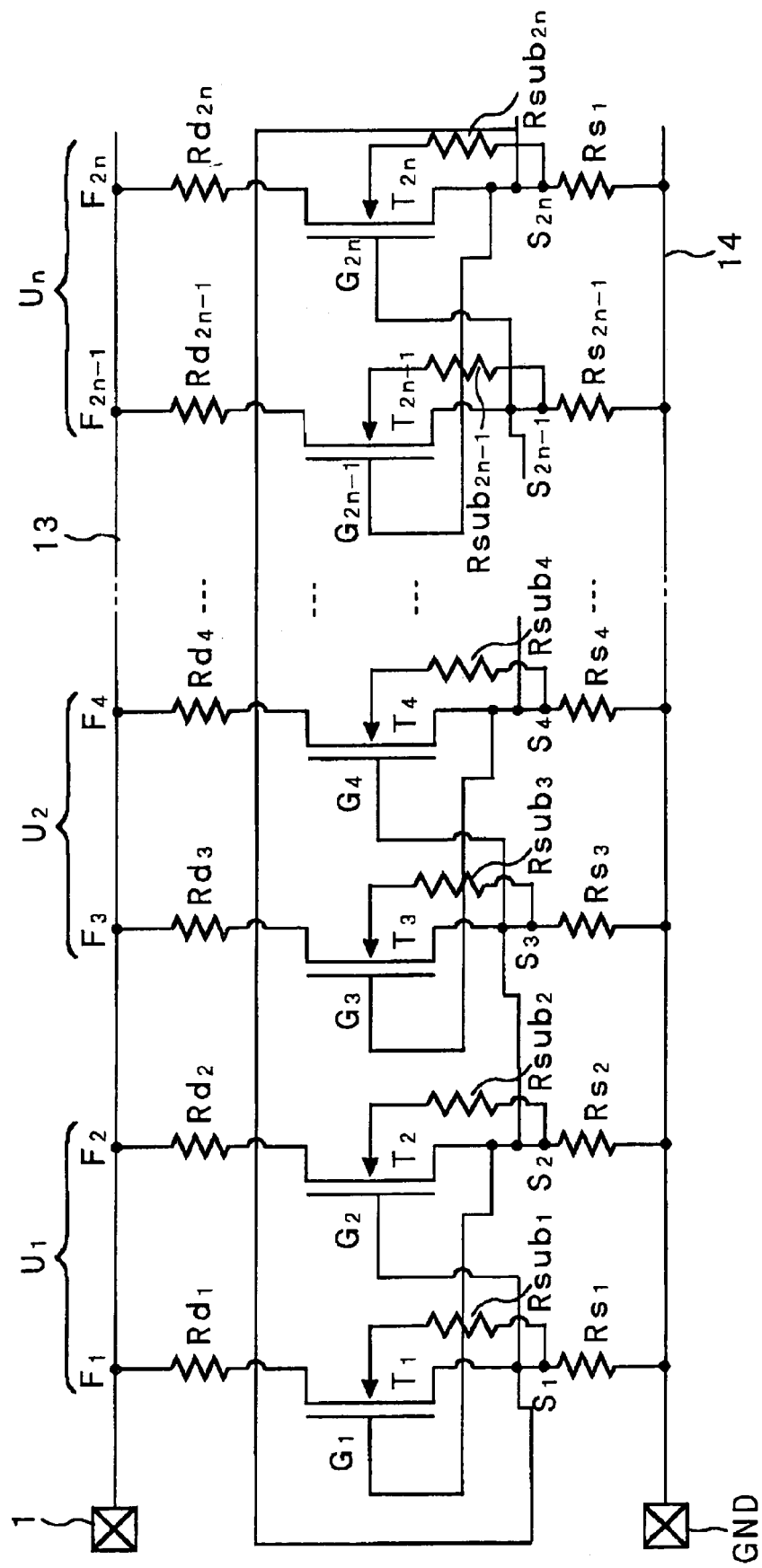
FIG. 1 is an equivalent circuit diagram illustrating an ESD protection element according to a first embodiment of the present invention.
Figure 2:
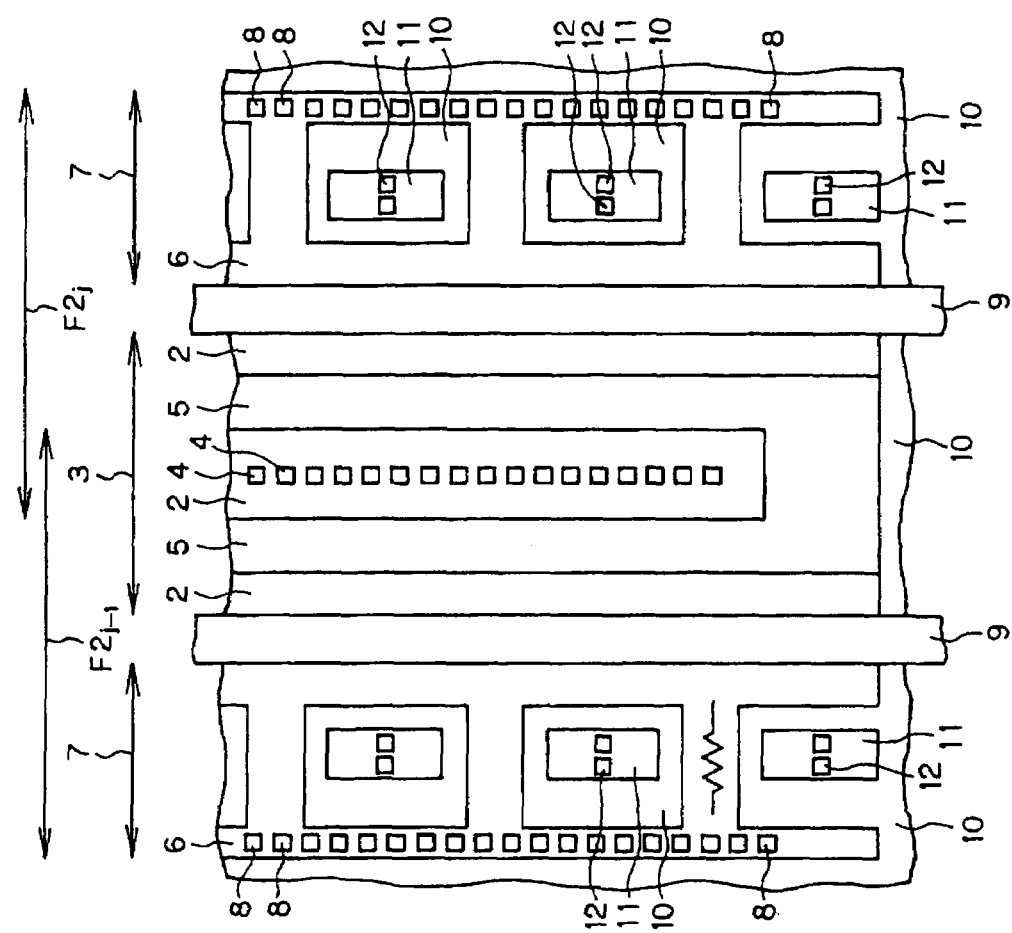
FIG. 2 is a plan view illustrating one unit of this ESD protection element.

Preferred embodiments of the present invention will now be described with reference to the accompanying drawings. A first embodiment of the present invention will be described first. FIG. 1 is an equivalent circuit diagram illustrating an ESD protection element according to a first embodiment of the present invention, and FIG. 2 is a plan view illustrating a first unit of the ESD protection element. As shown in FIG. 1, the ESD protection element includes an input wiring 13 connected to an input pad 1 to which a surge current is input, a reference-potential wiring 14 connected to a ground electrode GND, and 2n-number (where n is a natural number of 2 or greater) of fingers $F_1$ to $F_{2n}$ connected in parallel with one another across the input wiring 13 and reference-potential wiring 14. Each finger $F_i$ (where i is a natural number of 1 to 2n) includes a drain resistor $Rd_i$ (i=1 to 2n), an NMOS transistor $T_i$ (i=1 to 2n) and a source resistor $R_i$ (i=1 to 2n) connected in series in the order mentioned from the input wiring 13 to the reference-potential wiring 14. It should be noted that the input pad 1 and ground electrode GND serve also as an input pad and ground electrode of an element to be protected (not shown), namely the element protected by this ESD protection element.

Two mutually adjacent fingers $F_{2j-1}$ and $F_{2j}$ (where j is a natural number of 1 to n) form a pair and construct a single unit $U_j$. For example, fingers $F_1$ and $F_2$ construct one unit $U_1$, fingers $F_3$ and $F_4$ construct one unit $U_2$, and fingers $F_{2N-1}$ and $F_{2n}$ construct one unit $U_n$. Of the NMOS transistors that construct one unit, the source of one is connected to the gate of the other and the source of the other is connected to the gate of the first-mentioned NMOS transistor. That is, the source $S_{2j-1}$ of finger $F_{2j-1}$ is connected to the gate $G_{2j}$ of finger $F_{2j}$, and the source $S_{2j}$ of finger $F_{2j}$ is connected to the source $S_{2j-1}$ of finger $F_{2j-1}$. Further, the source $S_{2j}$ of finger $F_{2j}$ is connected to the source $S_{2j+1}$ of finger $F_{2j+1}$ of the next unit $U_{j+1}$. It should be noted that the source $S_{2n}$ of the $_{2n}$th finger $F_{2n}$ is connected to the source $S_1$ of the first finger $F_1$. As a result, 2n-number of fingers are connected in the form of a ring. Furthermore, the source $S_i$ of NMOS transistor $T_i$ of each finger $F_i$ is connected to the channel region of NMOS transistor $T_i$ via a substrate resistance $R_{sub}$.

As shown in FIG. 2, a P-well (not shown) is formed in the surface of a P-type silicon substrate (not shown) of this ESD protection element, and a heavily doped n$^+$ region (hereinafter termed n$^+$ region) 2 extending in one direction is formed (i.e., by ion implantation) in the surface of this P-well. The two fingers that construct one unit have a common drain region 3. A plurality of taps 4 are arrayed in one row along the longitudinal direction of the n$^+$ region 2 at the laterally central portion of the n$^+$ region 2. The taps 4 are connected to the input pad 1 shown in FIG. 1. Further, the ring-shaped region surrounding the row of taps 4 in the surface of the n⁺ region 2 constitutes a silicide blocking region 5. This is a region in which silicide is not formed. On the other hand, silicide (not shown) is formed on the surface of the n⁺ region 2 in the area other than that occupied by the silicide blocking region 5. The silicide blocking region 5 constitutes the drain resistor $Rd_i$ shown in FIG. 1.

N⁺ regions 6 are arrayed along the direction perpendicular to the longitudinal direction of the n⁺ region 2 so that the n⁺ region 2 lies between two n⁺ regions 6. Each n⁺ region 6 constitutes a source region 7 in each finger and corresponds to the source $S_i$ shown in FIG. 1. The n⁺ region 6 has the shape of a ladder extending in the same direction as that of the n⁺ region 2. A plurality of taps 8 are arrayed in a single row in the longitudinal direction of the n⁺ region 6 along the edge of the n⁺ region 6 that is farther from the n⁺ region 2. The taps 8 are connected to the ground electrode GND illustrated in FIG. 1. Further, the resistance of the n⁺ region 6 between a tap 8 and the channel region corresponds to the source resistor $Rs_i$ shown in FIG. 1, and the size of the source resistor $Rs_i$ is adjusted by the shape of the n⁺ region 6.

The region between the n⁺ region 2 (drain region 3) and n⁺ region 6 (source region 7) in the surface of the P-well serves as a channel region (not shown) and is a P-type region. A gate-oxide film (not shown) is provided above the channel region and a gate electrode 9 is provided on the film. The gate electrode 9 corresponds to the gate $G_i$ shown in FIG. 1.

Regions other than the n⁺ region 2, n⁺ region 6 and channel region in the surface of the P-well are STI (Shallow Trench Isolation) regions 10. Thus, the n⁺ region 6 (source region 7) is formed to have a plurality of the STI regions 10. An n⁺ region 11 is formed at one location in each STI region 10 in the n⁺ region 6, and two taps 12 are formed in the surface of the n⁺ region 11. The n⁺ region 11 is connected to the P-well and controls the potential of the P-well. The resistance of the P-well between the n⁺ region 11 and the channel region is the substrate resistance $Rsub_i$ shown in FIG. 1.

A wiring connecting the source $S_{2j-1}$ shown in FIG. 1 to gate $G_{2j}$, a wiring connecting the source $S_{2j}$ to gate $G_{2j-1}$, a wiring connecting the source $S_{2j}$ to source $S_{2j+1}$ and a wiring connecting the source $S_{2n}$ to source $S_1$ are formed inside a multiple-interconnection layer (not shown) provided on the P-type silicon substrate. These wirings are not shown in FIG. 2.

The operation of the ESD protection element according to the first embodiment of the present invention constructed as set forth above will now be described. When a surge current enters the input pad 1, as shown in FIGS. 1 and 2, all of the surge current is applied to the drain of finger $F_i$ (i=1 to 2n). When the voltage of the surge current reaches the trigger voltage of any finger, the NMOS transistor of the finger turns on and the finger snaps back. If we assume that the finger that snapped back is finger $F_{2j-1}$, then the potential of the source $S_{2j-1}$ rises by, e.g., 1 V, because the source resistor $Rs_{2j-1}$ is provided between the source $S_{2j-1}$ of the finger $F_{2j-1}$ and the ground electrode GND. As a result, the potential of the gate $G_{2j}$ of finger $F_{2j}$ rises, snapback voltage Vt1 falls, the NMOS transistor $T_{2j}$ turns on and the finger $F_{2j}$ snaps back. Accordingly, the fingers $F_{2j-1}$ and $F_{2j}$ belonging to unit $U_j$ both snap back. Further, the potential of the source $S_{2j}$ rises and this is accompanied by a rise in the potential of the gate $G_{2j-1}$ of the NMOS transistor $T_{2j-1}$ that turned on first. As a result, the voltage applied to the gate-oxide film of the NMOS transistor $T_{2j-1}$ that turned on first is mitigated and a current flows uniformly in the lateral direction of the channel region.

Next, owing to the rise in the potential of the source $S_{2j}$, the potential of the source $S_{2j+1}$ of finger $F_{2j+1}$ in unit $U_{j+1}$ rises, the potential of gate $G_{2j+2}$ rises and finger $F_{2j+2}$ snaps back. As a result, the potential of source $S_{2j+2}$ rises, the potential of gate $G_{2j+1}$ rises and finger $F_{2j+1}$ snaps back. Thus, the two fingers $F_{2j+1}$ and $F_{2j+2}$ belonging to unit $U_{j+1}$ both snap back. Accordingly, the two fingers $F_{2j+3}$ and $F_{2j+4}$ belonging to unit $U_{j+2}$ similarly snap back. Thus, when a finger belonging to unit $U_j$ snaps back first, unit $U_{j+1}$, unit $U_{j+2}$, unit $U_{j+3}$, . . . snap back sequentially in order of increasing subscript (this direction is referred to below as the forward direction). When unit $U_n$ snaps back, unit $U_1$ snaps back.

Owing to the rise in the potential of source $S_{2j-1}$ of finger $F_{2j-}$, the potential of the source $S_{2j-2}$ of unit $U_{j+1}$ rises, whereby the potential of gate $G_{2j-3}$ rises, finger $F_{2j-3}$ snaps back, the potential of source $S_{2j-3}$ rises, the potential of gate $G_{2j-2}$ rises and finger $F_{2j-}$ snaps back. As a result, the two fingers $F_{2j-2}$ and $F_{2j-3}$ belonging to unit $U_{j-1}$ both snap back.

In each of fingers, when the source potential of the NMOS transistor rises, the rise of the source potential is transferred to the channel region via the substrate resistance and the potential of the channel region rises. In this way, the transistor constituting each of fingers readily turns on. Thus, when one finger belonging to one unit snaps back first, first the other finger belonging to this unit snaps back, then the other units snap back sequentially in the forward and backward directions with this unit serving as the starting point, and eventually all fingers snap back. As a result, the surge current applied to input pad 1 flows to the ground electrode GND through all fingers.

Thus, in the first embodiment of the present invention, as described above, when a surge current is applied to input pad 1 and one finger snaps back, the other finger belonging to the same unit as that of this finger snaps back, then the other units snap back sequentially in the forward and backward directions with this unit serving as the starting point, and all fingers snap back rapidly. Accordingly, surge current is dispersed and flows to the ground electrode GND without concentrating in a small number of fingers. As a result, fingers are not destroyed and the protected element can be protected reliably.

Further, when the source potential of the finger that snapped back first rises, the other finger belonging to the same unit as that of this finger snaps back and the source potential of this other finger rises, whereby the gate potential of the finger that snapped back first rises rapidly. As a result, the finger that snapped back first can be prevented from being destroyed by current crowding.

Furthermore, in the ESD protection element according to this embodiment, the fingers per se serve also as trigger circuits and therefore it is unnecessary to provide dedicated trigger circuits. In addition, it is unnecessary to provide a diode for every finger. This makes it possible to reduce the overall layout area.

Furthermore, in the ESD protection element according to this embodiment, the source region 7 is partitioned by the STI regions 10, as shown in FIG. 2, and the n⁺ region 11 is provided within the STI region 10 of each source region 7. Consequently, the potential of the P-well can be controlled uniformly in highly precise fashion.

Figure 3:
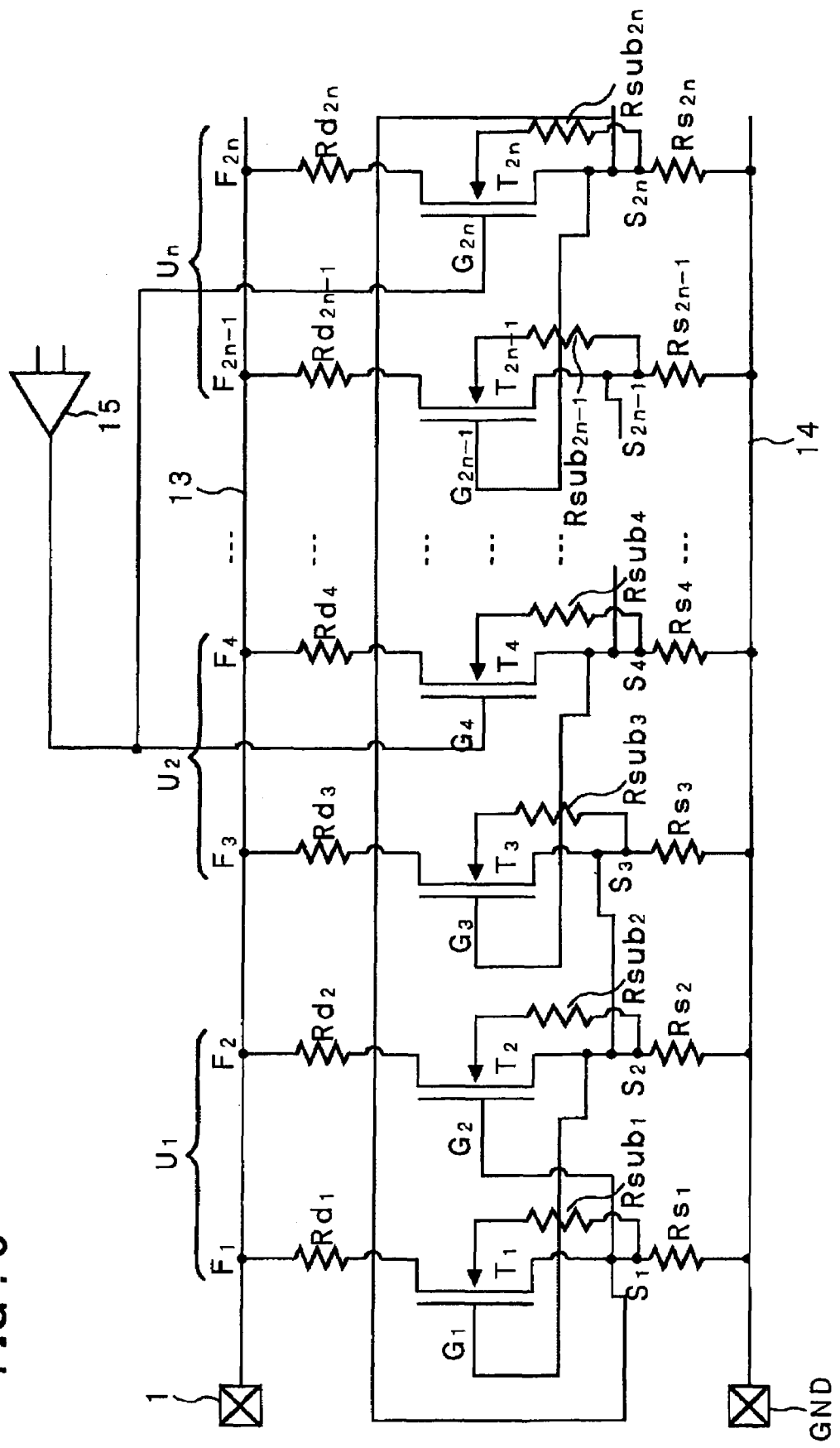
FIG. 3 is an equivalent circuit diagram illustrating an ESD protection element according to a first modification of the first embodiment.

A first modification of the first embodiment according to the present invention will be described next. FIG. 3 is an equivalent circuit diagram illustrating an ESD protection element according to this modification. As shown in FIG. 3, the ESD protection element according to this embodiment is characterised in that two fingers, for example, say fingers $F_4$ and $F_{2n}$, in the ESD protection element according to the first embodiment are used as drive elements and the other fingers are used as the protection elements. Here the fingers situated on both sides of the fingers serving as the drive elements are protection elements. Further, it is so arranged that the output of a predriver circuit 15 is applied to the gates of the transistors of the fingers serving as the drive elements, e.g., the gates of the transistors of fingers $F_4$ and $F_{2n}$. Structural aspects of the ESD protection element of this modification other than those mentioned above are similar to those of the ESD protection element according to the first embodiment (see FIG. 1).

The operation of the ESD protection element according to this modification constructed as set forth above will now be described. In this ESD protection element, the impedance of the gate of a finger serving as a drive element is higher than the impedances of the gates of the other fingers serving as the protection elements. When a surge current is applied to the input pad 1, therefore, the finger serving as the drive element snaps back first. Next, though an operation similar to that of the first embodiment described above, the other finger belonging to the same unit as the unit of the finger that snapped back first snaps back, all units snap back sequentially in the forward and backward directions with the unit that snapped back serving as the starting point, and the applied surge current escapes to the ground electrode GND through all fingers. Operation of the ESD protection element of this modification other than that described above is similar to that of the ESD protection element according to the first embodiment.

In the first modification, any number of fingers among a plurality of fingers connected in ring form are used as drive elements and the other fingers are used as protection elements. This means that drive elements and protection elements can be formed simultaneously. Further, since the number of drive elements can be selected at will, ESD protection elements of a plurality of types having numbers of drive elements that differ from one another can be formed in accordance with common design specifications. Effects of the ESD protection element of this modification other than those mentioned above are similar to those of the ESD protection element according to the first embodiment.

Figure 4:
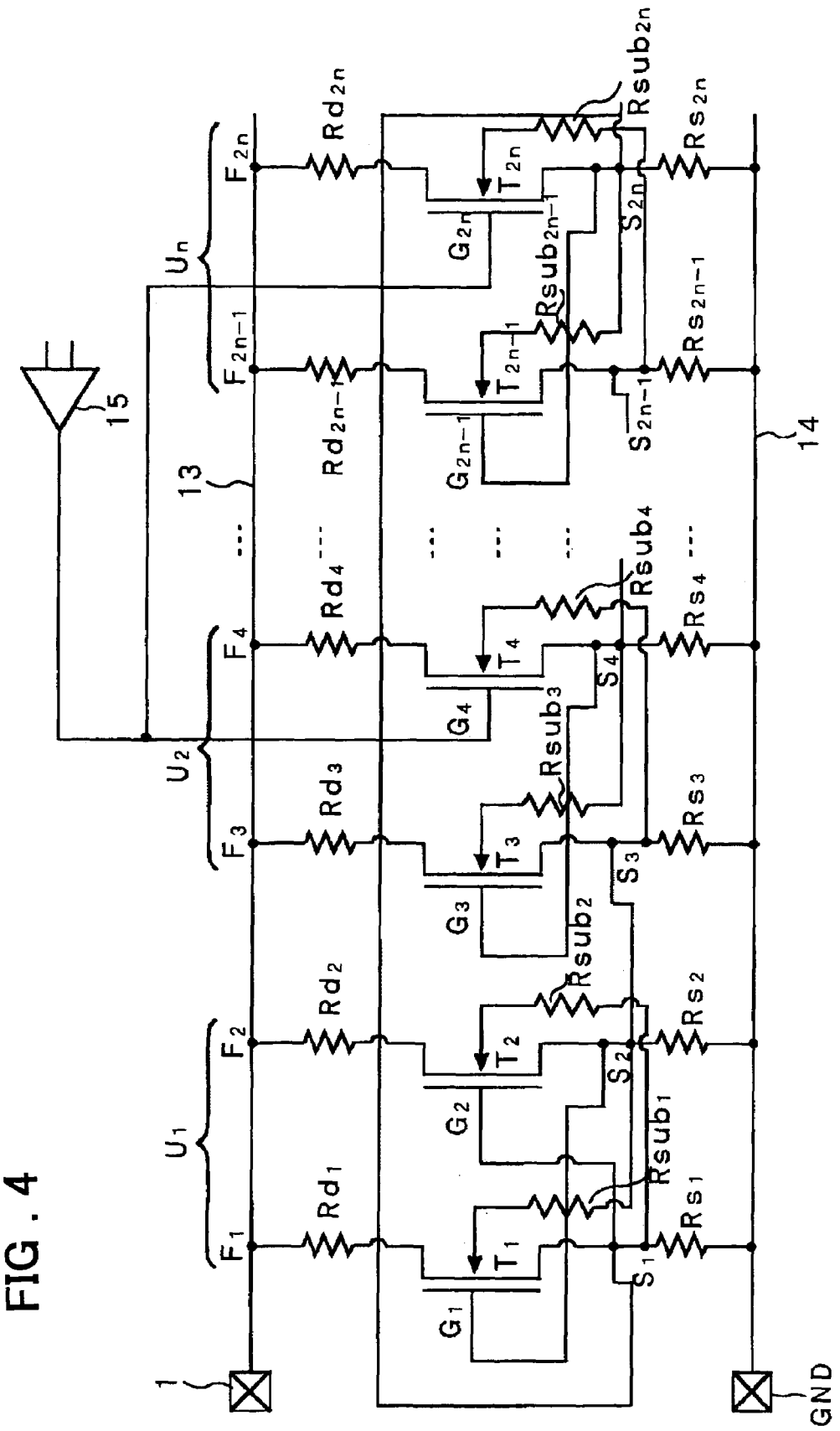
FIG. 4 is an equivalent circuit diagram illustrating an ESD protection element according to a second modification of the first embodiment.

A second modification of the first embodiment of the present invention will be described next. FIG. 4 is an equivalent circuit diagram illustrating an ESD protection element according to this modification. In the ESD protection element of this modification, as shown in FIG. 4, the source of each finger is connected via a substrate resistance to the channel of the other finger belonging to the same unit as that of the first-mentioned finger. For example, in unit $U_1$, the source $S_1$ of finger $F_1$ is connected to the channel of finger $F_2$ via substrate resistance $Rsub_2$, and the source $S_2$ of finger $F_2$ is connected to the channel of finger $F_1$ via substrate resistance $Rsub_1$. Structural aspects other than those of the ESD protection element according to this embodiment mentioned above are similar to those of the ESD protection element according to the first modification of this embodiment.

When a surge current is applied to the input pad 1 in the first modification described above, a finger used as a drive element snaps back first. By contrast, this modification is such that even in a case where a finger used as a protection element belonging to the same unit as that of the finger used as the drive element snaps back, the potential of the substrate resistance of the finger used as the drive element rises and the finger used as the drive element snaps back more readily. When a surge current has been applied, therefore, any finger may snap back first. Operations and effects of this modification other than those mentioned above are similar to those of the first modification.

It should be noted that although the number of fingers belonging to one unit is two in the first embodiment of the present invention described above and in the first and second modifications of the first embodiment, this does not impose a limitation upon the present invention and three or more fingers may be grouped into one unit.

Figure 5:
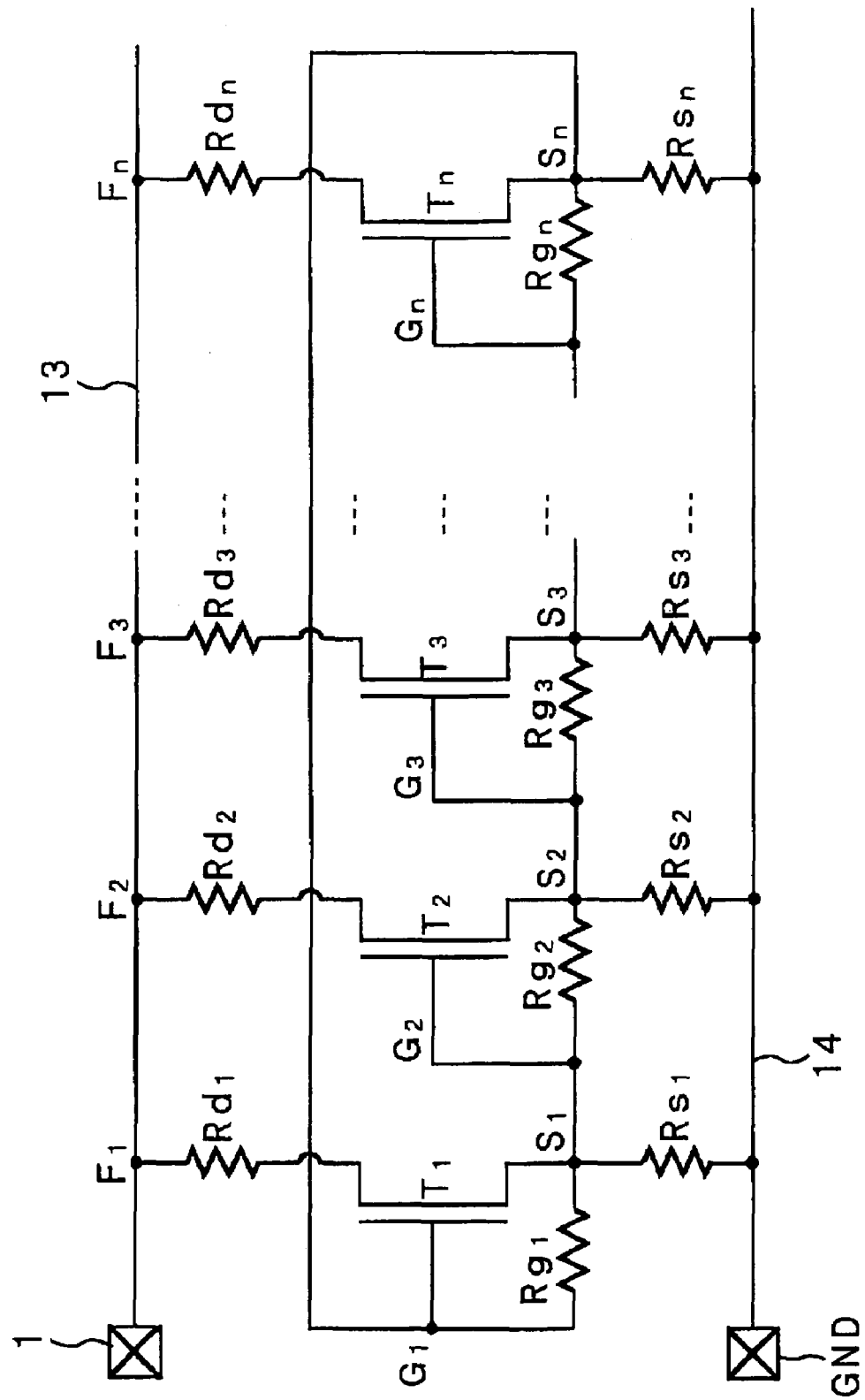
FIG. 5 is an equivalent circuit diagram illustrating an ESD protection element according to a second embodiment of the present invention.

A second embodiment of the present invention will be described next. FIG. 5 is an equivalent circuit diagram illustrating an ESD protection element according to this embodiment. In the first embodiment and its modifications, as described above, when two fingers are grouped as a single unit and one of these fingers snaps back, the other finger snaps back and, as a result, the gate potential of the first-mentioned finger rises and current flows uniformly into all fingers. By contrast, in the second embodiment, as shown in FIG. 5, units obtained by grouping a plurality of fingers are not formed. More specifically, n-number of fingers are connected in parallel with one another between the input pad 1 and the ground electrode GND. In each finger $F_i$ (i=1 to n), drain resistor $Rd_i$ (i=1 to n), NMOS transistor $T_i$ (i=1 to n) and source resistor $Rs_i$ (i=1 to n) are connected in series in order from the input pad 1 to the ground electrode GND. Further, source $S_k$ of a kth [where k is a natural number of 1 to (n−1)] finger $F_k$ is connected to gate $G_{k+1}$ of a (k+1)th finger $F_{k+1}$ and to source $S_{k+1}$ of finger $F_{k+1}$ via source-to-source resistor $Rg_{k+1}$. Furthermore, source $S_n$ of finger $F_n$ is connected to gate $G_1$ of NMOS transistor $T_1$ of finger $F_1$ and to source $S_1$ of finger $F_1$ via source-to-source resistor $Rg_1$. As a result, all of the fingers are connected into a ring-shaped configuration as a whole.

It should be noted that the width of each NMOS transistor is 40 μm, for example, and that the number of fingers is, e.g., 10 (n=10). Further, the ESD protection element according to this embodiment is designed in such a manner that when a 3-mA current, for example, flows into one finger, the next finger will be triggered. Furthermore, each source resistor $Rs_i$ and source-to-source resistor $Rg_i$ has a resistance of, e.g., 20 Ω. As a result, the value of resistance between the source of each finger and the ground electrode is, e.g., about 10 Ω. These resistance values, however, are not limited to the values cited above; optimum values are calculated based upon the characteristics required by the ESD protection element and the resistance values are set to these values.

The operation of the ESD protection element according to the second embodiment of the invention constructed as set forth above will now be described. When a surge current is applied to the input pad 1, as shown in FIG. 5, a voltage is applied to all fingers. As a result, in one finger, e.g., finger $F_i$, the NMOS transistor $T_i$ turns on and finger $F_i$ snaps back. Since a resistor comprising the source resistor $Rs_i$, etc., is provided between the source $S_i$ of this NMOS transistor $T_i$ and the ground electrode GND, the potential of source $S_i$ rises on the order of, e.g., 1 to 2 V at this time. When the potential of source $S_i$ rises, the potential of gate $G_{i+1}$ of NMOS transistor $T_{i+1}$ in the immediately adjacent finger $F_{i+1}$ rises, the snapback voltage of NMOS transistor $T_{i+1}$ falls and this NMOS transistor $T_{i+1}$ turns on. As a result, finger $F_{j+1}$ snaps back. As a result, from this point onward and in similar fashion, finger $F_{i+2}$ snaps back owing to snapback of finger $F_{i+1}$, whereby finger $F_{i+3}$ snaps back. This operation continues in chain-like fashion so that each finger snaps back sequentially in ascending order (i.e., in the forward direction). Then, when finger $F_n$ snaps back, finger $F_1$ snaps back.

When finger $F_i$ snaps back and the potential of source $S_i$ rises, this potential is transferred to gate $G_i$ via source-to-source resistor $Rg_i$ and the potential of gate $G_i$ rises. As a result, the voltage impressed upon the gate-oxide film of gate $G_i$ is mitigated. Further, the potential of source $S_i$ is transferred also to source $S_{i-1}$ of finger $F_{i+1}$ via source-to-source resistor $Rg_i$, and the potential of source $S_{i-1}$ is transferred also to gate $G_{i-1}$ and to source $S_{i-2}$ of finger $F_{i-2}$ via source-to-source resistor $Rg_{i-1}$. Thus, the potential of source $S_i$ of finger $F_i$ that snapped back first is transferred to the gate and source of each finger in order of decreasing subscript (i.e., in the backward direction). Owing to the action of the source-to-source resistor $R_g$, the change in the potential transferred in the backward direction is mitigated rapidly. For example, the amount of increase in the potential of gate $G_i$ in a case where finger $F_i$ has snapped back is, e.g., 30 to 50% the amount of increase in the potential of gate $G_{i+1}$.

Thus, the second embodiment of the present invention is such that when a surge current is applied to the input pad 1 and one finger snaps back, the other fingers snap back sequentially in the forward direction with the first-mentioned finger serving as the starting point and all fingers snap back rapidly. Accordingly, surge current is dispersed and flows to the ground electrode GND without concentrating in a small number of fingers. As a result, fingers are not destroyed and the protected element can be protected reliably.

Further, when the source potential of the finger that snapped back first rises, this source potential is transferred to the gate of this finger. Accordingly, the gate potential of the finger that snapped back first rises rapidly and approaches the drain potential. As a result, the finger that snapped back first can be prevented from being destroyed by current crowding.

Furthermore, the source-to-source resistor $Rg_{i+1}$ is provided between the sources $S_i$ and $S_{i+1}$ of mutually adjacent fingers $F_i$ and $F_{i+1}$, respectively. When finger $F_i$ snaps back, therefore, the rise in the potential of source $S_i$ is transferred reliably to gate $G_{i+1}$ of finger $F_{i+1}$ and finger $F_{i+1}$ can be made to snap back in reliable fashion.

Furthermore, in the ESD protection element according to this embodiment, the fingers per se serve also as trigger circuits and therefore it is unnecessary to provide special-purpose trigger circuits. In addition, it is unnecessary to provide a diode for every finger. This makes it possible to reduce the overall layout area.

Figure 6:
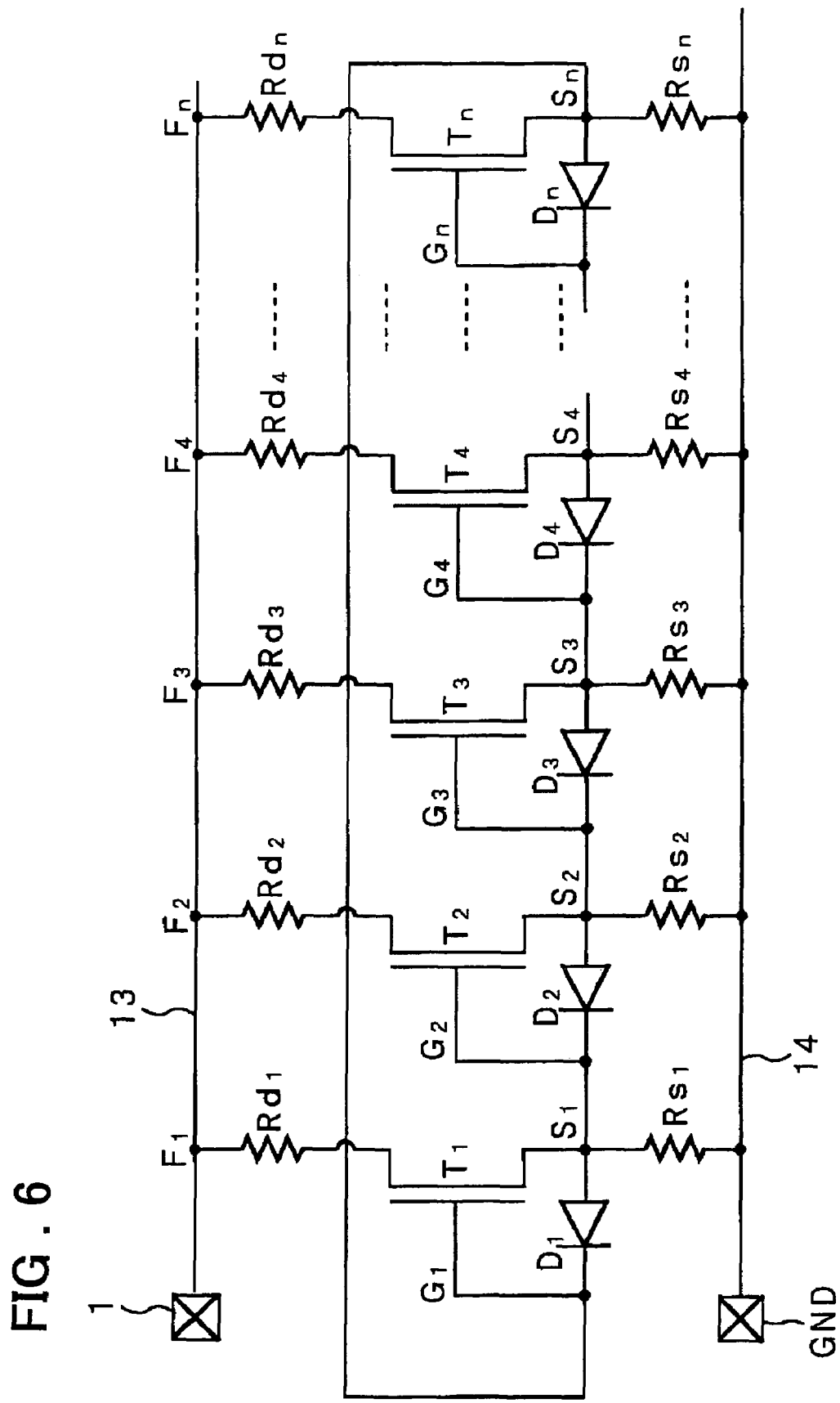
FIG. 6 is an equivalent circuit diagram illustrating an ESD protection element according to a modification of the second embodiment.

A modification of the second embodiment of the invention will be described next. FIG. 6 is an equivalent circuit diagram illustrating the ESD protection element according to this modification. In comparison with the ESD protection element according to the second embodiment (see FIG. 5), the ESD protection element of this modification differs in that it is provided with diodes $D_i$ (i=2 to n) instead of source-to-source resistors $Rg_i$ (i=2 to n), as illustrated in FIG. 6. Diode $D_{i+1}$ provided between source $S_i$ and source $S_{i+1}$ has its anode connected to source $S_{i+1}$ and its cathode connected to source $S_i$. Structural aspects and operation of the ESD protection element of this modification other than those mentioned above are similar to those of the ESD protection element according to the second embodiment.

In comparison with the second embodiment described above, this modification is such that transfer of the potential of source $S_i$ to the source $S_{i+1}$ disposed in the forward direction as seen from the source $S_i$ can be suppressed. As a result, the rise in the potential of the source $S_i$ is transferred reliably by gate $G_{i+1}$ of finger $F_{i+1}$. Effects of this modification other than those mentioned above are similar to those of the second embodiment.

Figure 7:
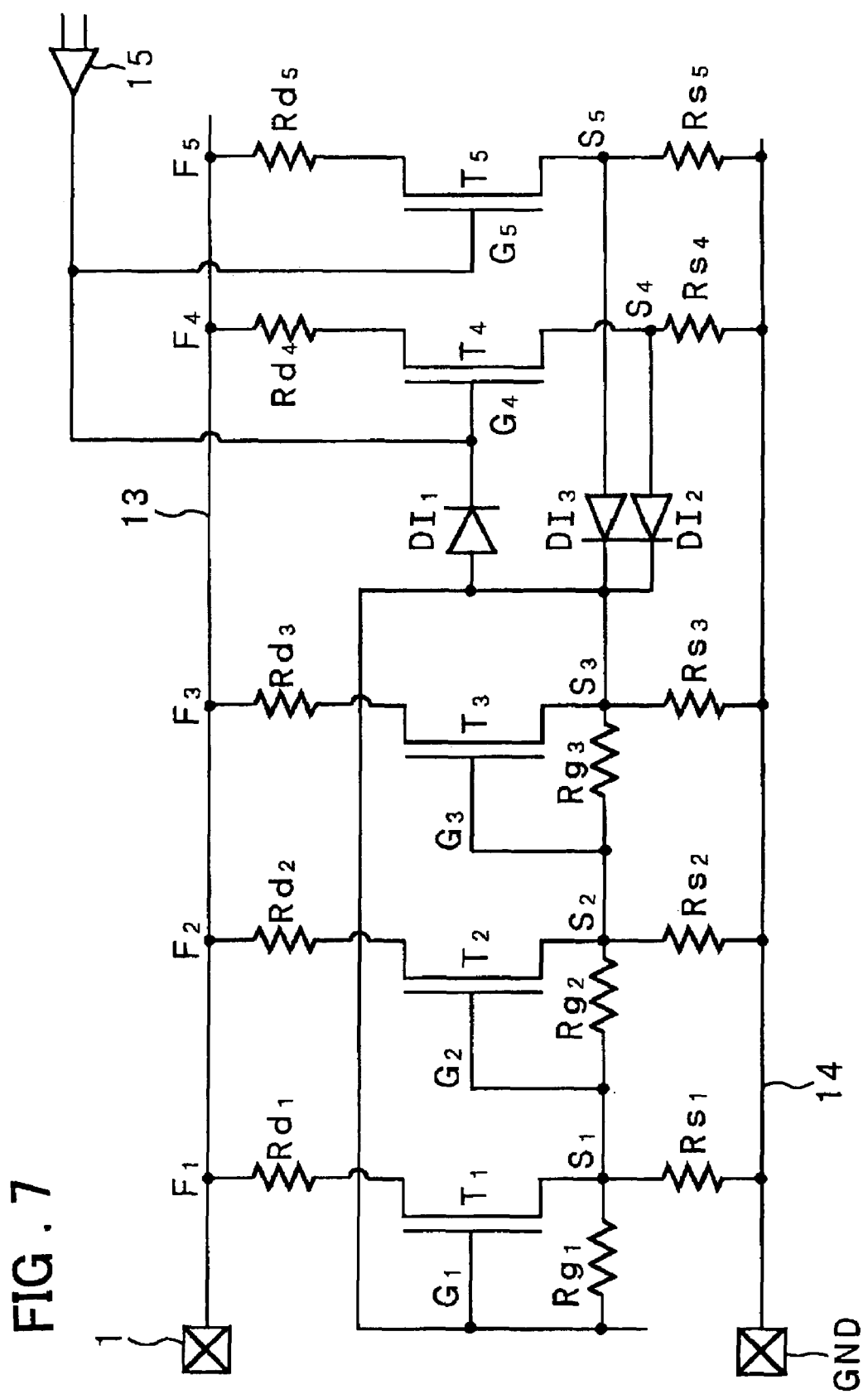
FIG. 7 is an equivalent circuit diagram illustrating an ESD protection element according to a third embodiment of the present invention.

A third embodiment of the present invention will be described next. FIG. 7 is an equivalent circuit diagram illustrating an ESD protection element according to this embodiment. As shown in FIG. 7, the ESD protection element according to this embodiment is characterized in that in the ESD protection element according to the second embodiment described above, two fingers, e.g., fingers $F_4$ and $F_5$, are used as drive elements and the other fingers, e.g., fingers $F_1$, $F_2$ and $F_3$, are used as protection elements. It should be noted that only five fingers are illustrated in FIG. 7 for the sake of convenience, though the number of fingers in this embodiment is not limited to five.

The output of the predriver circuit 15 is applied to the gates of the transistors of the fingers serving as the drive elements, e.g., the fingers $F_4$ and $F_5$. Further, a diode $DI_1$ is connected between source $S_3$ and gates $G_4$ and $G_5$ in such a manner that its anode is connected to source $S_3$ and its cathode to gates $G_4$ and $G_5$. Further, a diode $DI_2$ is connected between source $S_4$ and source $S_3$ in such a manner that its anode is connected to source $S_4$ and its cathode to source $S_3$. Furthermore, a diode $DI_3$ is connected between source $S_5$ and source $S_3$ in such a manner that its anode is connected to source $S_5$ and its cathode to source $S_3$. Structural aspects of the ESD protection element of the third embodiment other than those mentioned above are similar to those of the ESD protection element according to the second embodiment (see FIG. 6).

The operation of the ESD protection element according to the third embodiment of the invention constructed as set forth above will now be described. When a surge current is applied to the input pad 1, the gate potential rises in the fingers $F_4$ and $F_5$ serving as the drive elements owing to the gate-to-drain coupling capacitance. Consequently, the fingers $F_4$ and $F_5$ serving as the drive elements snap back before the fingers $F_1$, $F_2$ and $F_3$ serving as the protection elements. Ordinarily, fingers $F_4$ and $F_5$ snap back substantially simultaneously. However, if at least one of fingers $F_4$ and $F_5$ snaps back, the potential of at least one of sources $S_4$ and $S_5$ rises as a result and the rise in potential is transferred to gate $G_1$ of finger $F_1$ via diode $DI_2$ and/or $DI_3$, respectively. Finger $F_1$ then snaps back, whereby fingers $F_2$ and $F_3$ snap back sequentially. When finger $F_3$ snaps back, the potential of source $S_3$ rises and the rise in potential is transferred to gates $G_4$ and $G_5$ via diode $DI_1$. If either of finger $F_4$ or $F_5$ has not snapped back, then this finger snaps back. As a result, all fingers snap back and the surge current is released to the ground electrode GND.

In the third embodiment of the present invention, any number of fingers among a plurality of fingers connected in ring form are used as drive elements and the other fingers are used as protection elements. This means that drive elements and protection elements can be formed simultaneously. Further, since the number of drive elements can be selected at will, ESD protection elements of a plurality of types having numbers of drive elements that differ from one another can be formed in accordance with common design specifications. Effects of the ESD protection element of this embodiment other than those mentioned above are similar to those of the ESD protection element according to the second embodiment.

Figure 8:
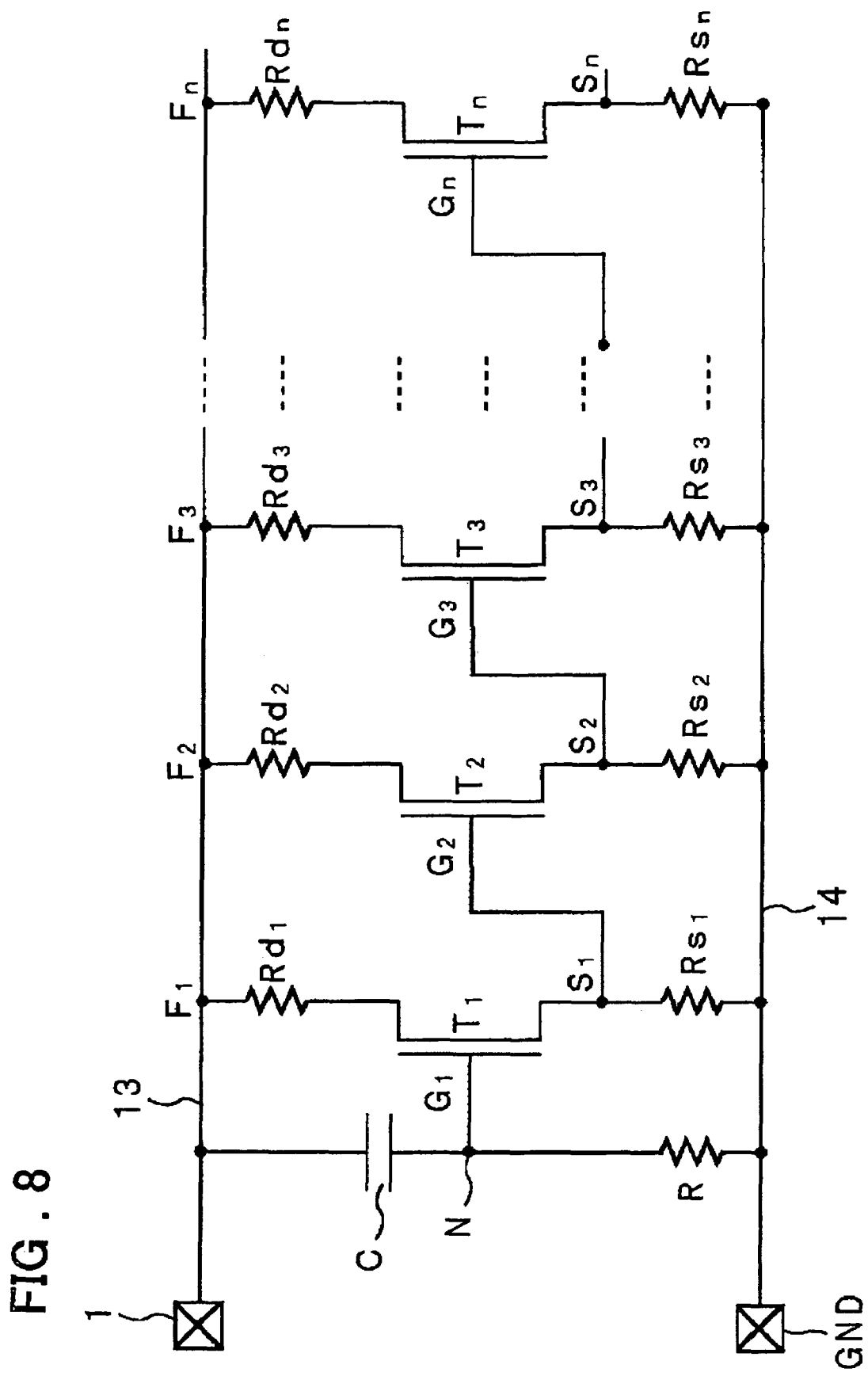
FIG. 8 is an equivalent circuit diagram illustrating an ESD protection element according to a fourth embodiment of the present invention.

A fourth embodiment of the present invention will be described next. FIG. 8 is an equivalent circuit diagram illustrating an ESD protection element according to this embodiment. As shown in FIG. 8, the ESD protection element according to this embodiment differs from the ESD protection element of the second embodiment (see FIG. 5) in that the source-to-source resistors $Rg_i$ (i=1 to n) are not provided and the sources of the fingers are not connected together. Further, in this ESD protection element, a capacitor C and a resistor R are connected in series with each other between the input pad 1 and the ground electrode GND, and a connection node N at which the capacitor C and resistor R are tied is connected to the gate $G_1$ of the NMOS transistor $T_1$ of finger $F_1$. That is, one end of the capacitor C is connected to the input pad 1 and the other end of the capacitor C is connected to one end of the resistor R via the node N. The other end of the resistor R is connected to the ground electrode GND. As a result, gate coupling is provided to the gate $G_1$. It should be noted that the capacitance of capacitor C is, e.g., 50 to 100% of the gate capacitance of gate $G_1$, the resistance of resistor R is, e.g., 10 k$\Omega$, and time constant of the circuit comprising the capacitor C and resistor R is adjusted so as to be, e.g., 10 ns. Structural aspects other than those of the ESD protection element according to the fourth embodiment mentioned above are similar to those of the ESD protection element according to the second embodiment.

The operation of the ESD protection element according to the fourth embodiment of the invention constructed as set forth above will now be described. Unlike the ESD protection element according to the first to third embodiments described above, the ESD protection element according to this embodiment is such that it has been decided that the finger that snaps back first when a surge current enters the input pad 1 is the finger $F_1$. More specifically, when a surge current is applied to the input pad 1, as shown in FIG. 8, the potential of gate $G_1$ rises via the gate coupling implemented by the capacitor C and resistor R. As a result, the initial voltage at snapback of finger $F_1$ falls and finger $F_1$ snaps back. Accordingly, the potential of source $S_1$ of finger $F_1$ rises, the rise in potential is applied to gate $G_2$ of finger $F_2$ and finger $F_2$ snaps back. Thenceforth, and in similar fashion, fingers $F_3, F_4, \ldots F_n$ snap back sequentially. As a result, all fingers $F_i$ (i=1 to n) snap back and the surge current flows in the ground electrode GND through all fingers. It should be noted that by adjusting the time constant of the segment comprising the capacitor C and resistor R to an appropriate value, the potential of gate $G_1$ can be kept high during the time that the surge current is flowing through the finger $F_1$ and the potential of gate $G_1$ returns to ground potential after the surge current finishes flowing.

In the fourth embodiment of the present invention, the fact that gate coupling is provided to gate $G_1$ of finger $F_1$ means that the potential of gate $G_1$ will rise when a surge current is applied to the input pad 1. Consequently, the trigger voltage $Vt_1$ of finger $F_1$ can be made lower than the trigger voltage of the other fingers and finger $F_1$ can always be made to snap back first. When the surge current is applied, a positive potential is applied to gate $G_1$. This reduces stress upon the gate-oxide film of gate $G_1$ and makes it possible to prevent current crowding by passing a current uniformly in the direction along the width of the channel region. As a result, the finger $F_1$ that snapped back first can be prevented from being destroyed.

It should be noted that the size of finger $F_1$ for triggering need not be the same as that of the other fingers $F_2$ to $F_n$; it may be smaller, for example, than that of the other fingers. As a result, if various parameters are optimized, it is possible to use finger $F_1$ in an input/output buffer that operates at high speed. Further, a dynamic gate floating scheme or the like rather than the gate coupling scheme may be applied to the finger $F_1$ for triggering. Furthermore, though it is assumed in this embodiment that the method of connection between fingers is a domino method, the present invention is not limited to this method and it is possible to adopt a method in which units are formed by a plurality of fingers and snap back is caused to occur unit by unit in a manner similar to that of the first embodiment.

Figure 9:
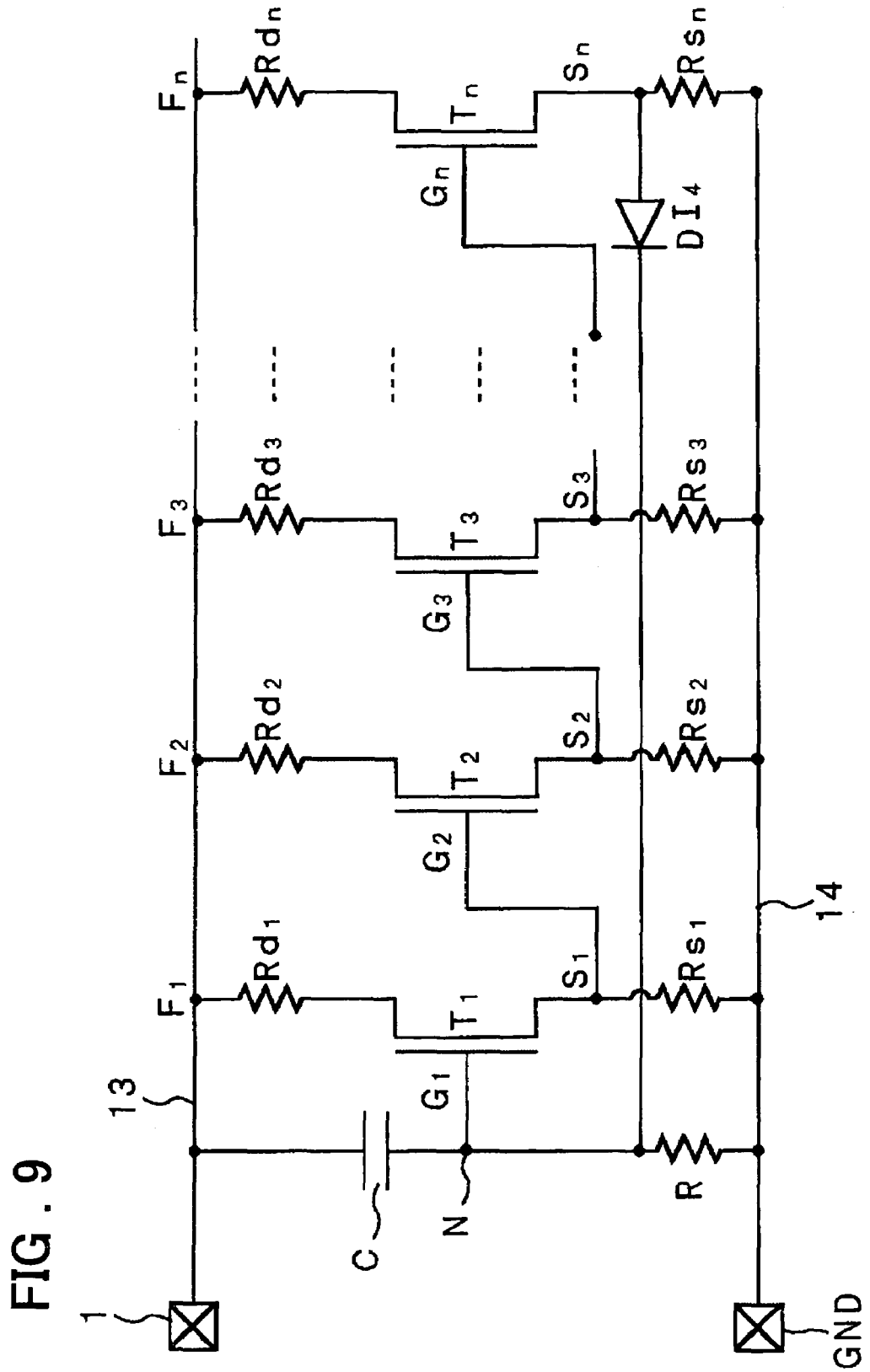
FIG. 9 is an equivalent circuit diagram illustrating an ESD protection element according to a first modification of the fourth embodiment.

A first embodiment of the fourth embodiment of the present invention will be described next. FIG. 9 is an equivalent circuit diagram illustrating an ESD protection element according to this modification. As shown in FIG. 9, source $S_n$ of finger $F_n$ in this embodiment is connected to gate $G_1$ of finger $F_1$ via a diode $DI_4$. The anode of diode $DI_4$ is connected to the source $S_n$ and the gate of the diode is connected to gate $G_1$. Structural aspects other than those of the ESD protection element according to this modification mentioned above are similar to those of the ESD protection element according to the fourth embodiment (see FIG. 8).

This modification is such that if a finger other than finger $F_1$ for triggering should happen to snap back first, finger $F_1$ will snap back when finger $F_n$ snaps back. Hence all fingers can be made to snap back. Actions and effects of this modification other than those mentioned above are similar to those of the fourth embodiment.

Figure 10:
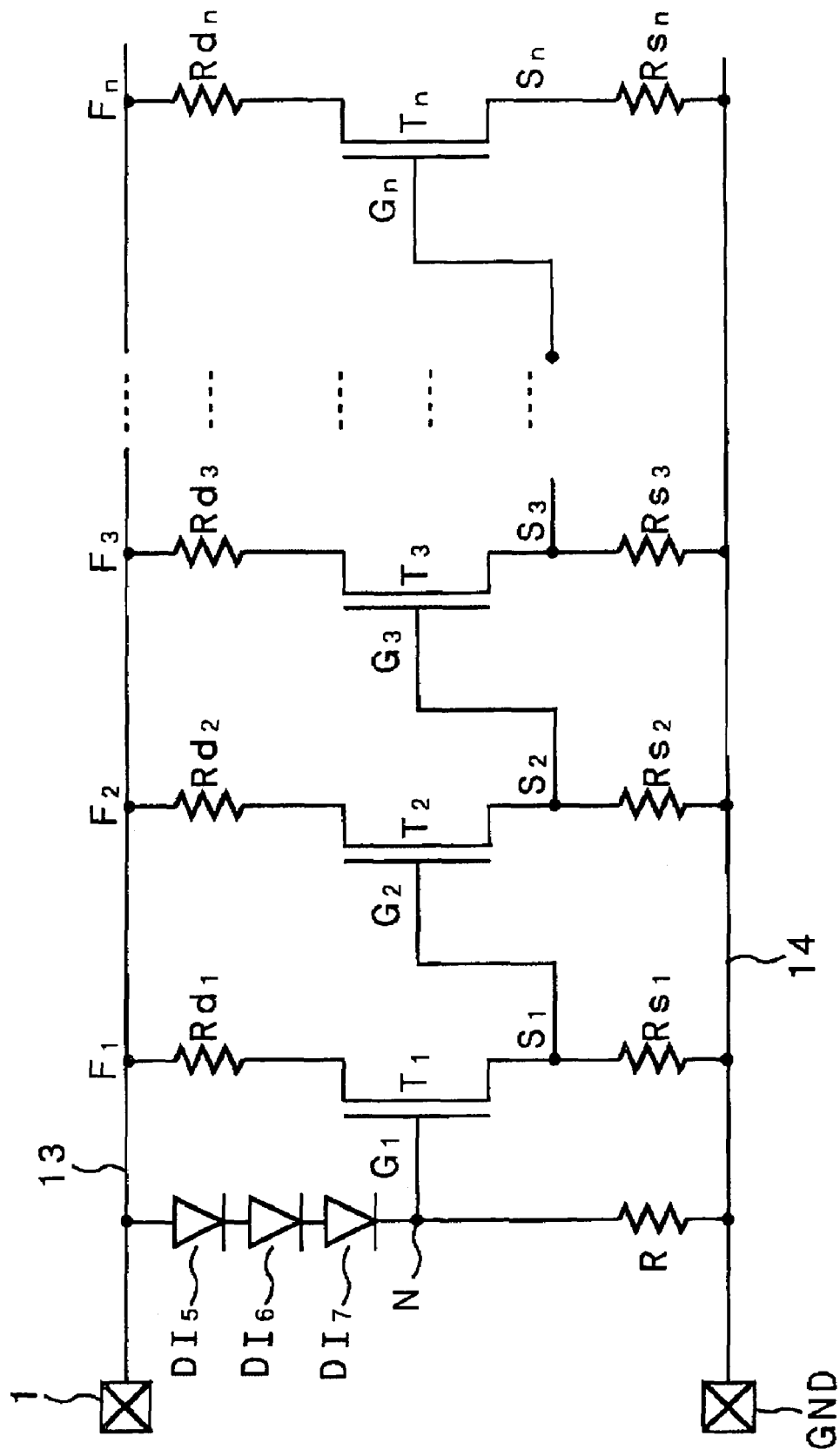
FIG. 10 is an equivalent circuit diagram illustrating an ESD protection element according to a second modification of the fourth embodiment.

A second modification of the fourth embodiment of the present invention will be described next. FIG. 10 is an equivalent circuit diagram illustrating an ESD protection element according to this modification. As shown in FIG. 10, three diodes $DI_5$ to $DI_7$ rather than the capacitor C of the ESD protection element of the fourth embodiment (see FIG. 8) are connected in series with one another. More specifically, the anode of diode $DI_5$ is connected to input pad 1, the cathode of diode $DI_5$ is connected to the anode of diode $DI_6$, the cathode of diode $DI_6$ is connected to the anode of diode $DI_7$ and the cathode of diode $D_7$ is connected to the connection node N. Structural aspects of the ESD protection element of this modification other than those mentioned above are similar to those of the ESD protection element according to the fourth embodiment.

The operation of the ESD protection element according to this modification will be described next. When a surge current is applied to the input pad 1 and the surge voltage reaches 2 to 3 V, for example, diodes $DI_5$ to $DI_7$ become conductive and a positive potential is applied to the gate $G_1$ of finger $F_1$, as a result of which the finger $F_1$ snaps back. Operation from this point onward is similar to that of the fourth embodiment described above. In this modification, the voltage applied to gate $G_1$ can be adjusted by selecting the threshold voltages and number of the diodes provided between the input pad 1 and gate $G_1$. Effects of the ESD protection element of this second modification other than those mentioned above are similar to those of the fourth embodiment.

Figure 11:
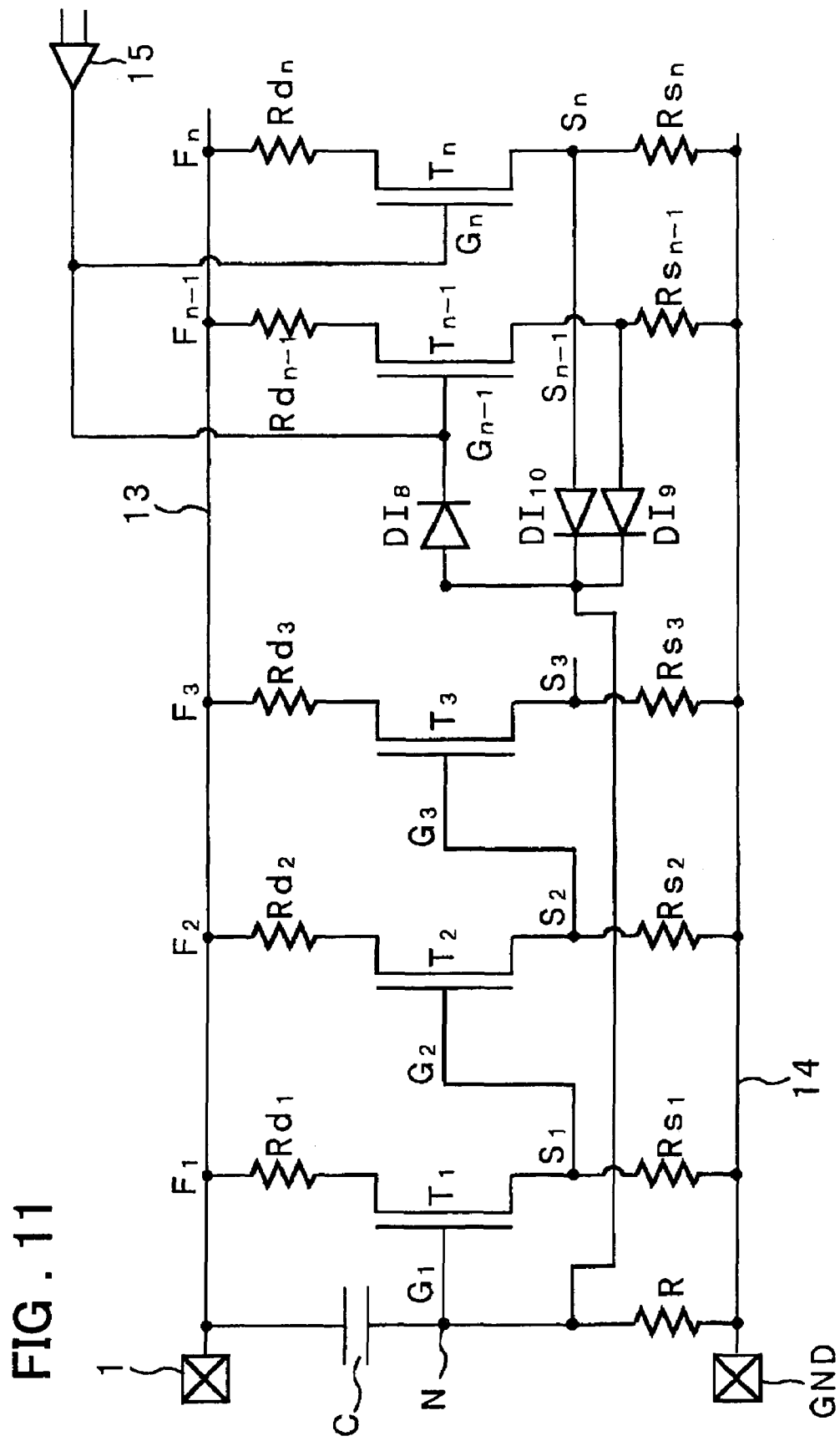
FIG. 11 is an equivalent circuit diagram illustrating an ESD protection element according to a fifth embodiment of the present invention.

A fifth embodiment of the present invention will now be described. FIG. 11 is an equivalent circuit diagram illustrating an ESD protection element according to this embodiment. As shown in FIG. 11, the fifth embodiment is a combination of the third and fourth embodiments described above. That is, this embodiment is such that among the fingers $F_2$ to $F_n$, which exclude finger $F_1$ for triggering, in the fourth embodiment, two fingers $F_{n-1}$ and $F_n$, for example, are used as drive elements. More specifically, it is so arranged that the output of the predriver circuit 15 is applied to the gates $G_{n-1}$ and $G_n$ of fingers $F_{n-1}$ and $F_n$ serving as the drive elements, respectively. Further, a diode $DI_8$ is provided between node N and gates $G_{n-1}$, $G_n$, the anode of diode $DI_8$ is connected to node N and the cathode of diode $DI_8$ is connected to gates $G_{n-1}$ and $G_n$. Further, a diode $DI_9$ is provided between source $S_{n-1}$ and node N, the anode of diode $DI_9$ is connected to source $S_{n-1}$ and the cathode of diode $DI_9$ is connected to node N. Furthermore, a diode $DI_{10}$ is provided between source $S_n$ and node N, the anode of diode $DI_{10}$ is connected to source $S_n$ and the cathode of diode $DI_{10}$ is connected to node N. The source $S_{n-2}$ of finger $F_{n-1}$ (not shown) is connected to node N. Structural aspects other than those of the ESD protection element according to the fifth embodiment mentioned above are similar to those of the ESD protection element according to the fourth embodiment (see FIG. 8).

The operation of the ESD protection element according to the fifth embodiment constructed as set forth above will now be described. When a surge current is applied to the input pad 1, as shown in FIG. 11, the potential of gate $G_1$ rises and finger $F_1$ snaps back by an operation similar to that of the fourth embodiment described above. As a result, fingers $F_2$, $F_3$, $F_4$, and $F_{n-2}$ (not shown) snap back sequentially. Meanwhile, the rise in the potential of gate $G_1$ is transferred to the gates $G_{n-1}$ and $G_n$ of the respective fingers $F_{n-1}$ and $F_n$, which serve as the drive elements, via the diode $DI_8$, and fingers $F_{n-1}$ and $F_n$ snap back. Even if fingers $F_{n-1}$ and $F_n$ should happen to snap back before the triggering finger $F_1$, the source $S_{n-1}$ or $S_n$ of finger $F_{n-1}$ or $F_n$ will rise and the rise in potential will be transferred to the gate $G_1$ of finger $F_1$ via diode $DI_9$ or $DI_{10}$, whereby finger $F_1$ snaps back. All fingers snap back as a result. Operation of the ESD protection element of this embodiment other than that described above is similar to that of the ESD protection element according to the fourth embodiment (see FIG. 8).

In the fifth embodiment, any number of fingers among the plurality of fingers constructing the ESD protection element are used as drive elements and the other fingers are used as protection elements. This means that drive elements and protection elements can be formed simultaneously. Further, since the number of drive elements can be selected at will, ESD protection elements of a plurality of types having numbers of drive elements that differ from one another can be formed in accordance with common design specifications. Effects of the ESD protection element of this embodiment other than those mentioned above are similar to those of the ESD protection element according to the fourth embodiment.

Figure 12:
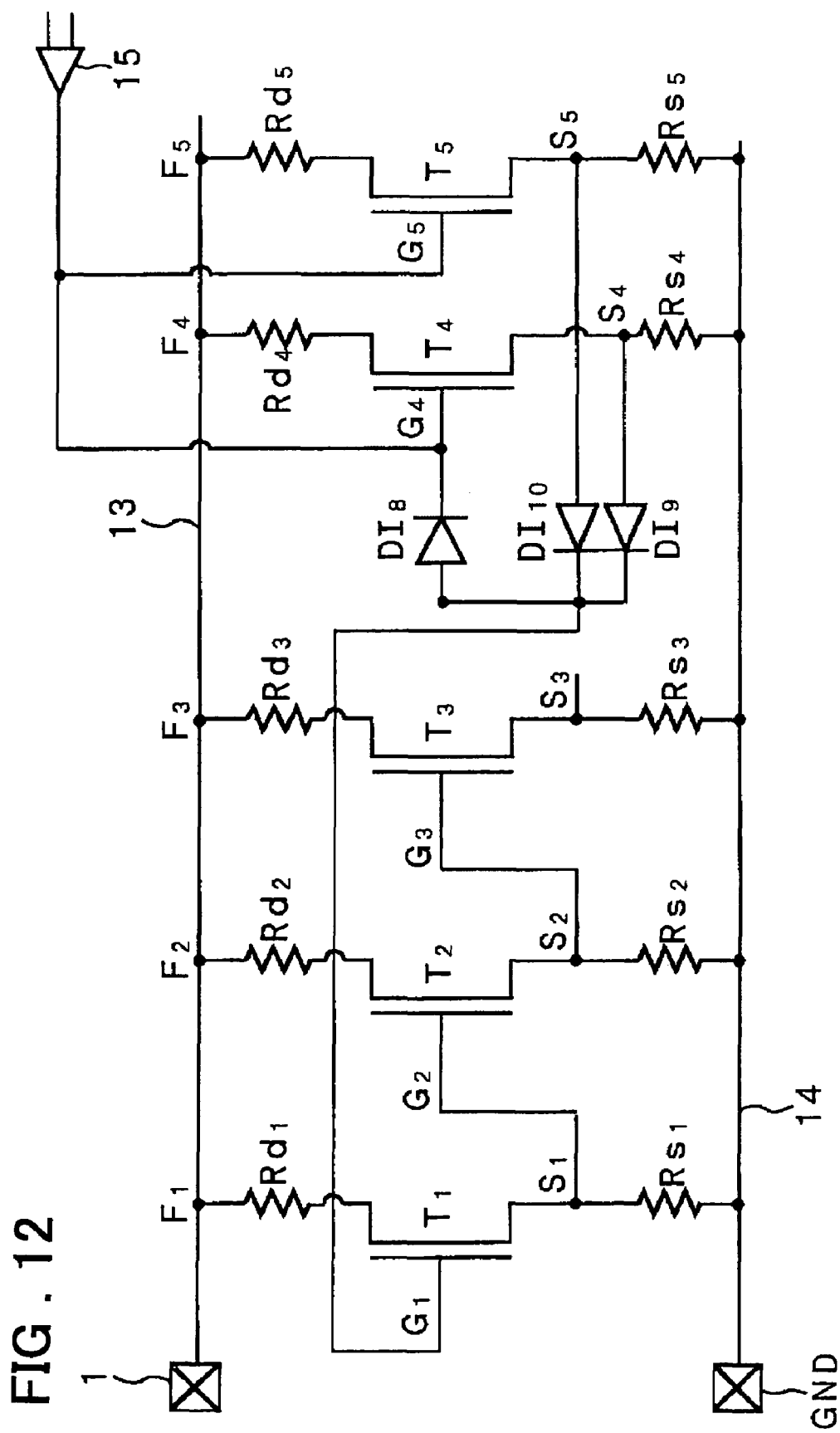
FIG. 12 is an equivalent circuit diagram illustrating an ESD protection element according to a modification of the fifth embodiment.

A modification of the fifth embodiment of the present invention will be described next. FIG. 12 is an equivalent circuit diagram illustrating an ESD protection element according to this modification. In this modification, the capacitor C and resistor R are deleted from the ESD protection element of the fifth embodiment (FIG. 11). It should be noted that only five fingers are illustrated in FIG. 12 for the sake of convenience, though the number of fingers in this embodiment is not limited to five. Fingers $F_{n-2}$, $F_{n-1}$ and $F_n$ in the ESD protection element of the fifth embodiment correspond to fingers $F_3$, $F_4$ and $F_5$, respectively, of the ESD protection element of this modification. Structural aspects of the ESD protection element of the fifth embodiment other than those mentioned above are similar to those of the ESD protection element according to the fifth embodiment (see FIG. 11).

This modification differs from the fifth embodiment in that the capacitor C and resistor R (see FIG. 11) have been deleted. This means that finger $F_1$ is not a trigger element that snaps back before fingers $F_2$ to $F_{n-2}$. When a surge current is applied to the input pad 1, therefore, finger $F_4$ or $F_5$ having a higher gate impedance snaps back first. As a result, the potential of source $S_4$ or $S_5$ of finger $F_4$ or $F_5$ rises, the rise in potential is transferred to the gate $G_1$ of finger $F_1$ and finger $F_1$ snaps back. When finger $F_1$ snaps back, fingers $F_2$ and $F_3$ snap back sequentially, as a result of which all fingers snap back. On the other hand, if finger $F_4$ or $F_5$ snaps back and the potential of source $S_4$ or $S_5$ rises, this rise in potential is transferred to gates $G_4$ and $G_5$ via diode $DI_9$ or $DI_{10}$ and diode $DI_8$ and the potentials of gates $G_4$ and $G_5$ rise. As a result, the gate potential of finger $F_4$ or $F_5$ that snapped back first can be made to rise rapidly and the element can be protected from destruction caused by local current crowding. Actions and effects of this modification other than those mentioned above are similar to those of the ESD protection element (see FIG. 11) of the fifth embodiment.

Figure 13:
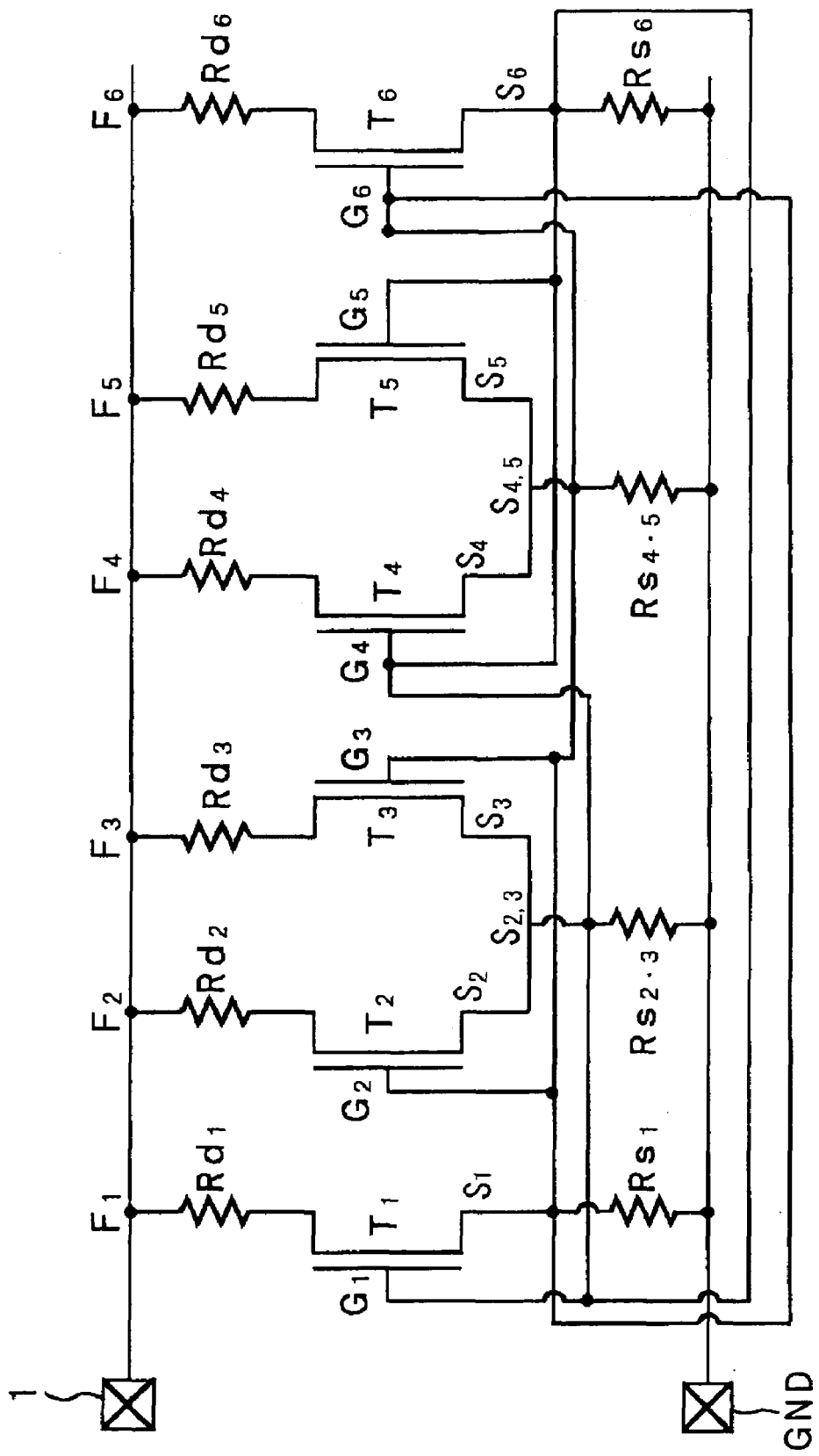
FIG. 13 is an equivalent circuit diagram illustrating an ESD protection element according to a sixth embodiment of the present invention.
Figure 14:
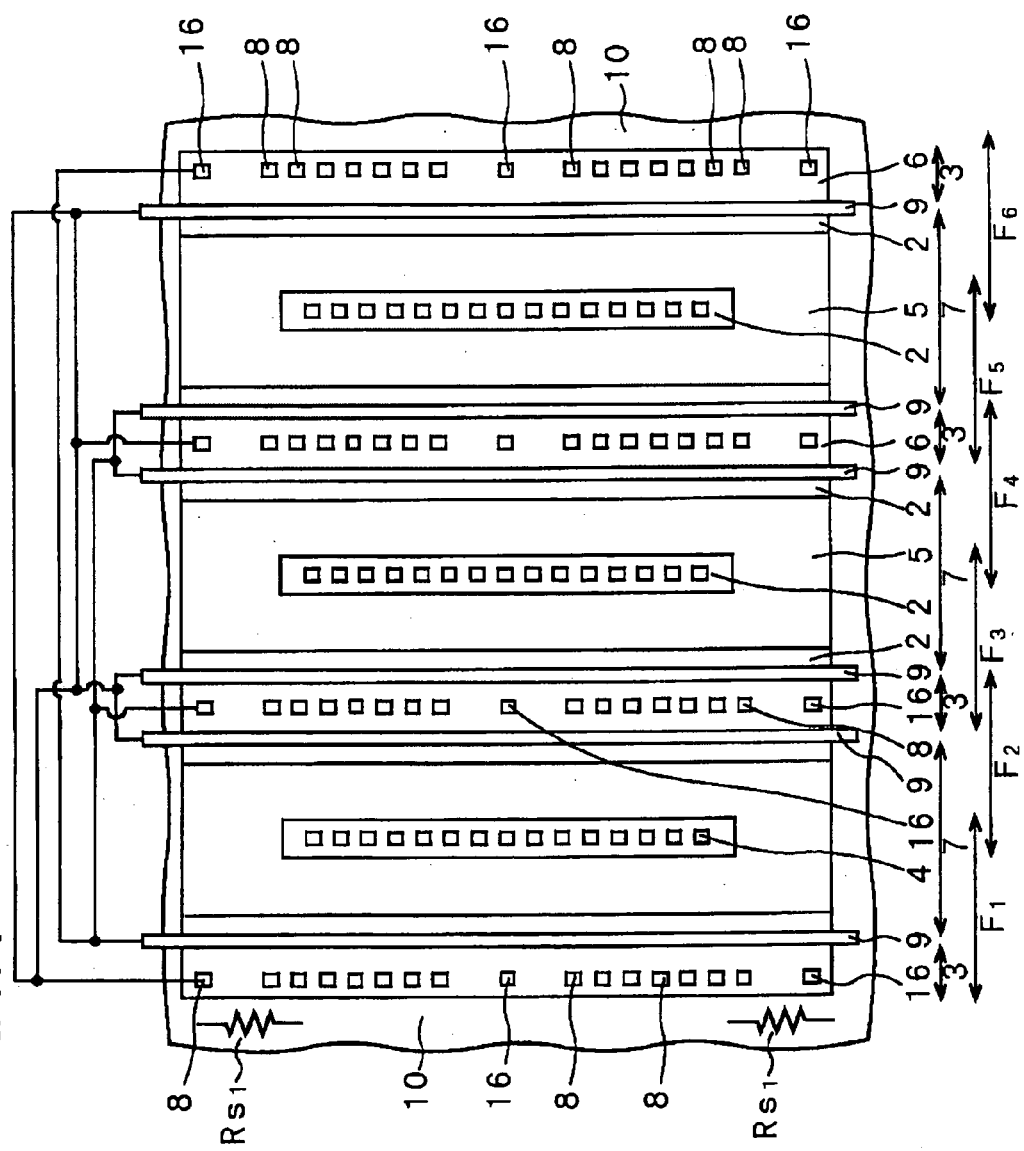
FIG. 14 is a plan view illustrating this ESD protection element.
Figure 15:
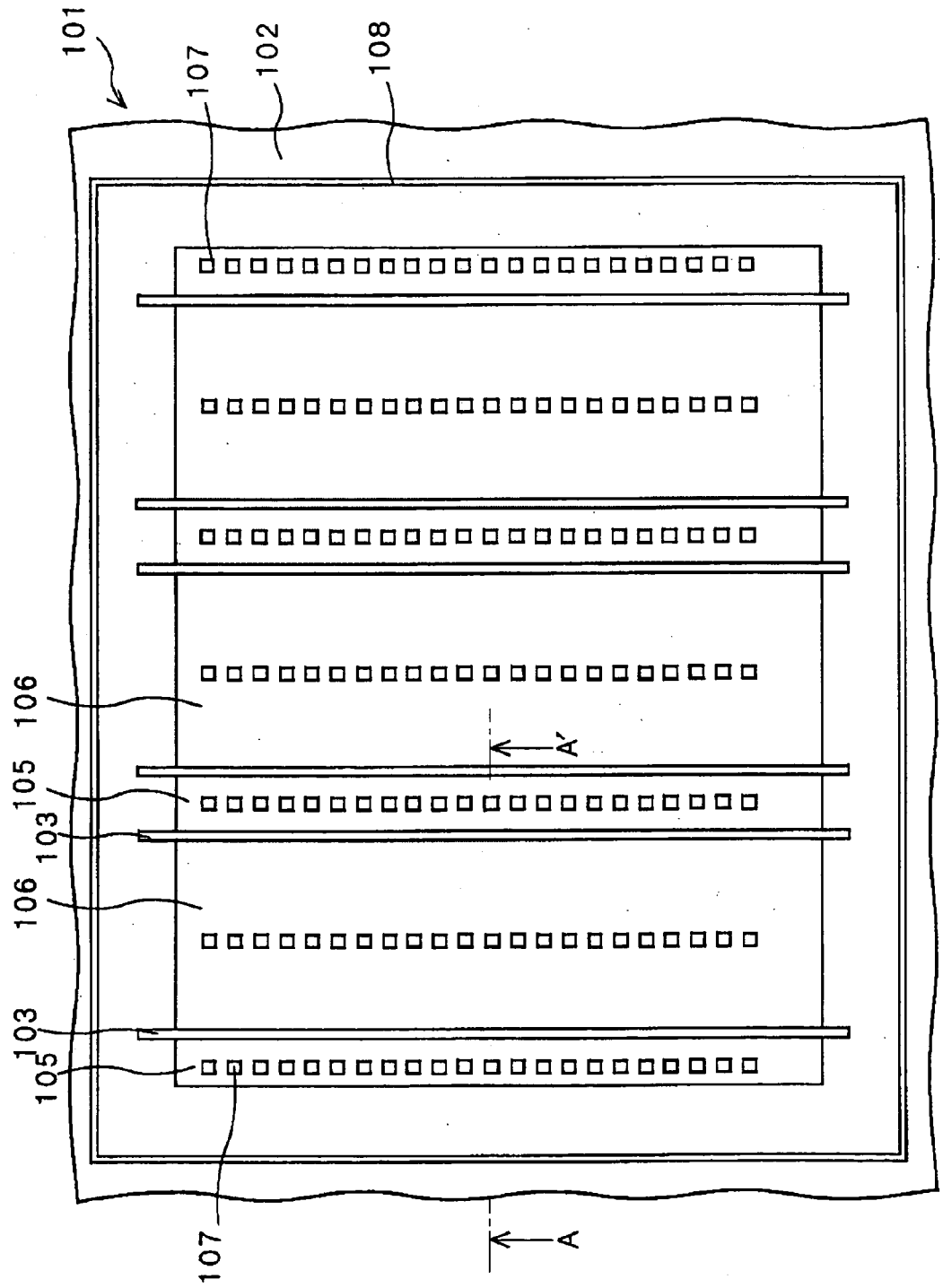
FIG. 15 is a plan view illustrating a MOS protection element according to the prior art.
Figure 16:
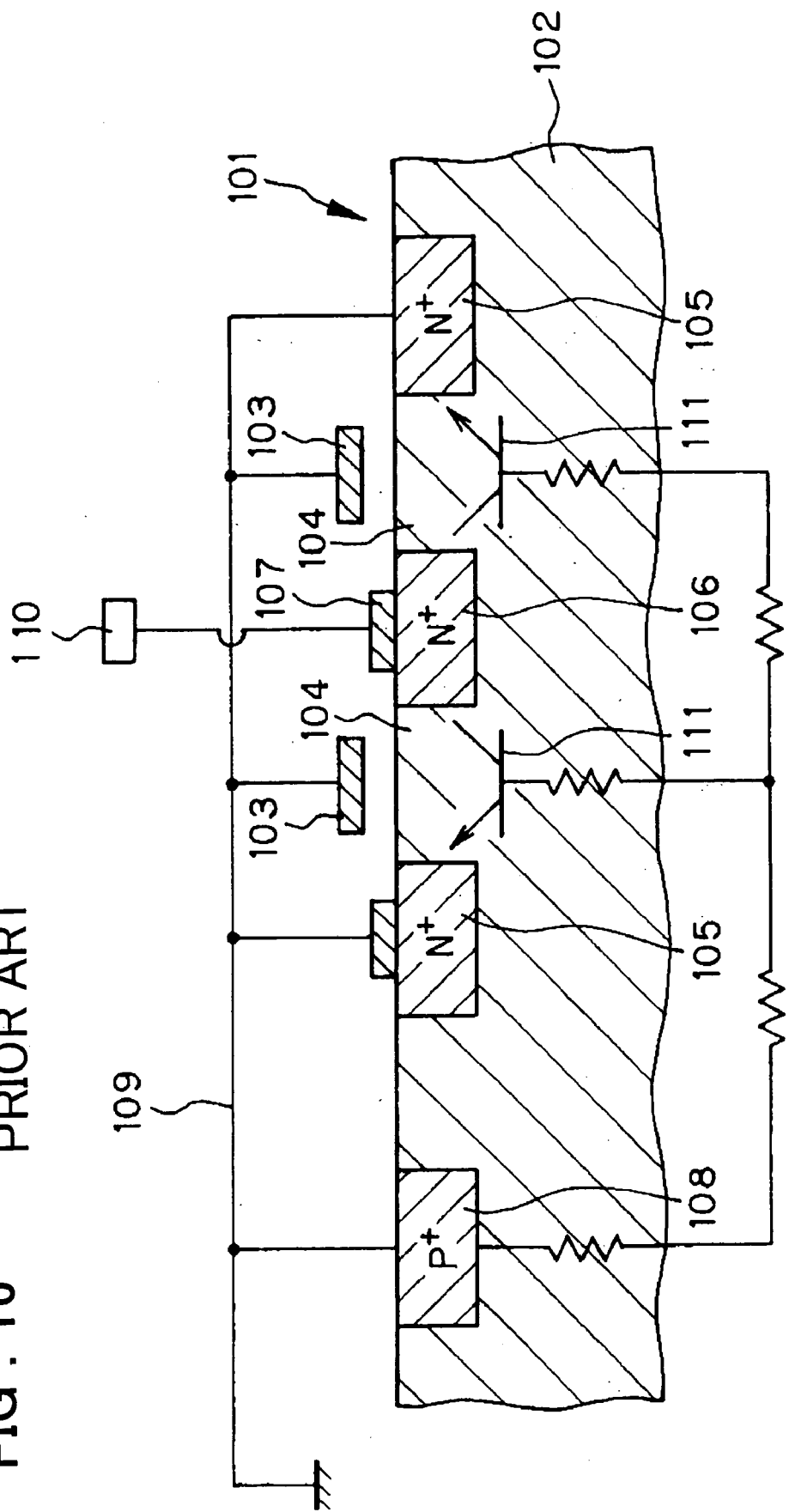
FIG. 16 is a diagram illustrating a cross section taken along line A–A' in FIG. 15 as well as an equivalent circuit thereof.
Figure 17:
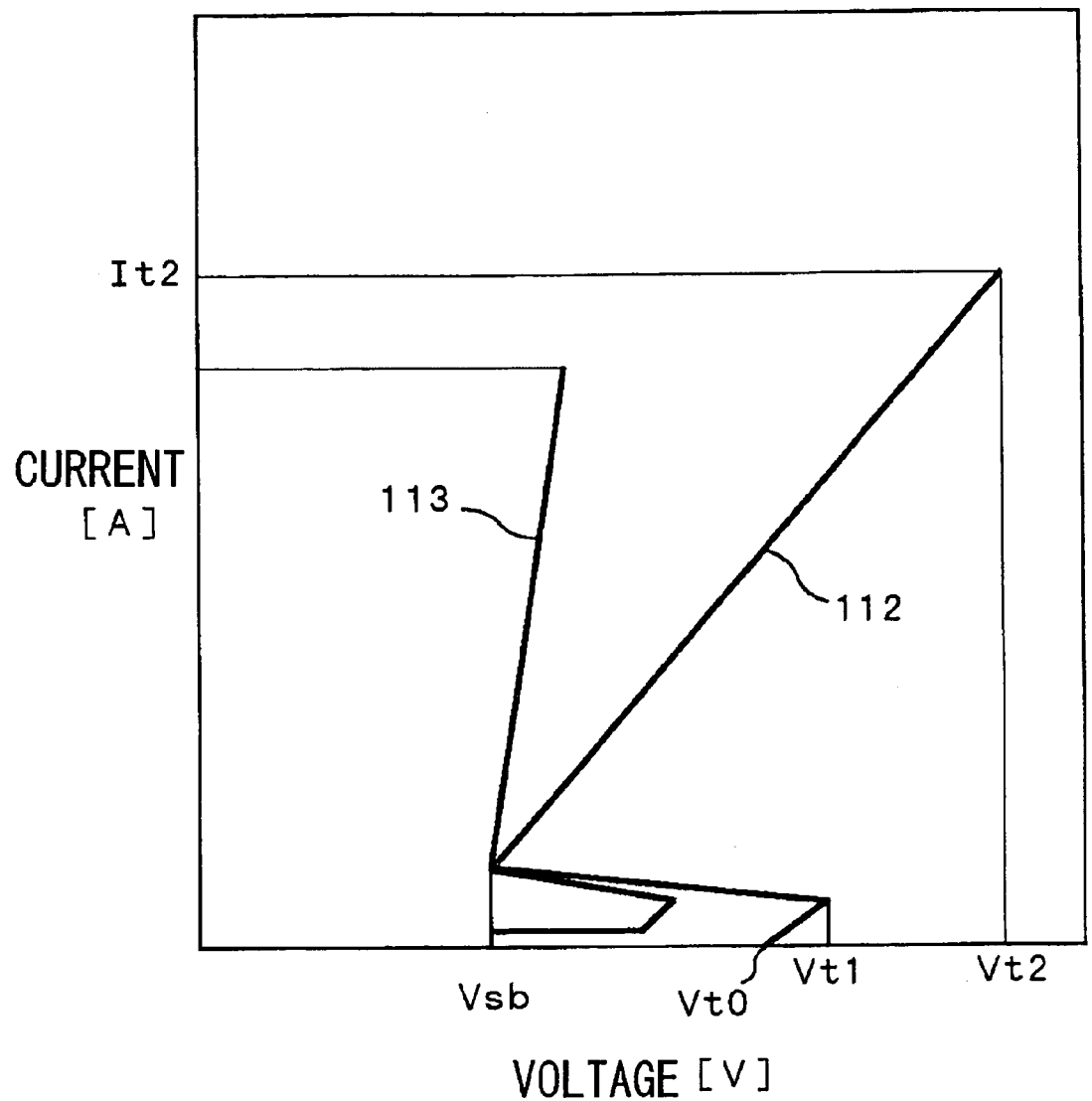
FIG. 17 a graph illustrating the operating characteristic of this MOS-type protection element, in which voltage applied to the protection element is plotted along the horizontal axis and current that flows into the protection element is plotted along the vertical axis.
Figure 18:
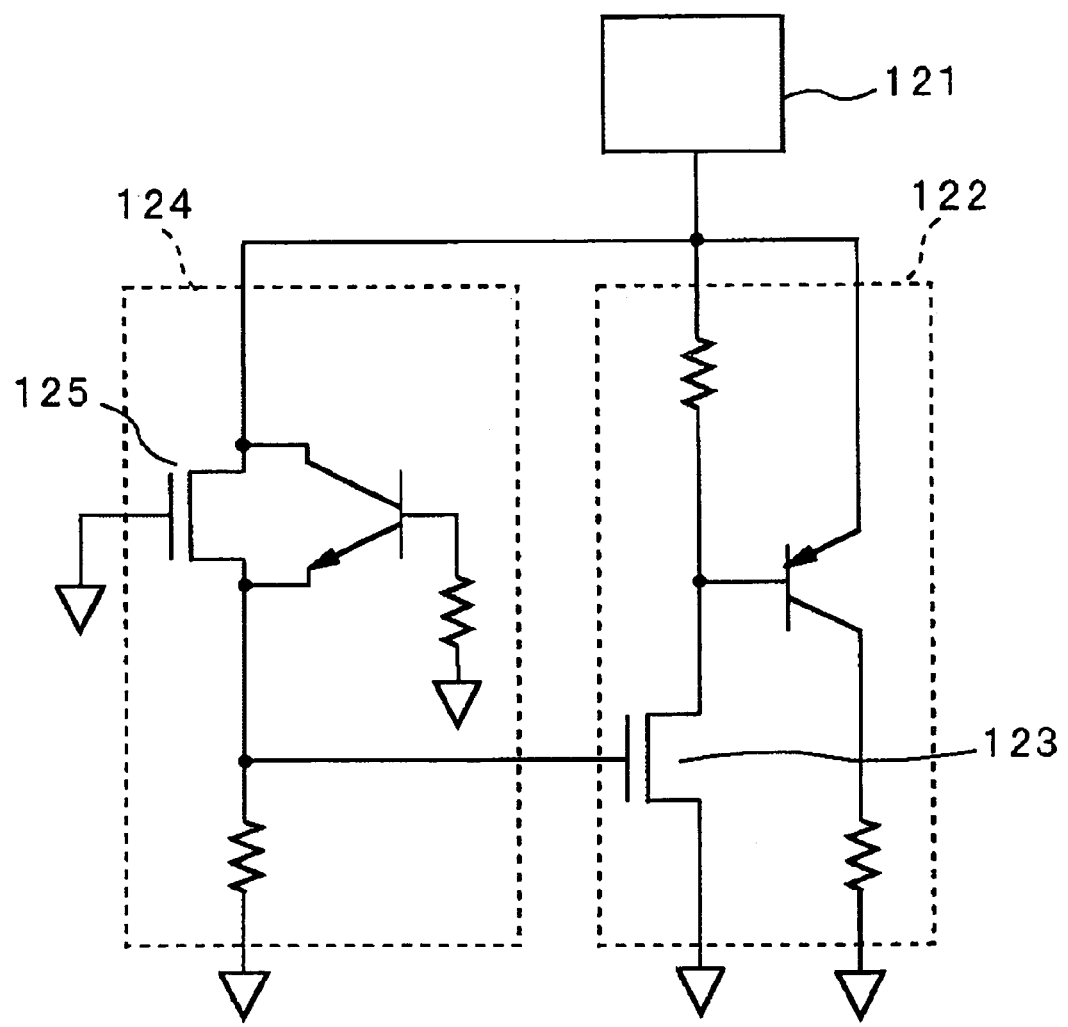
FIG. 18 is an equivalent circuit diagram illustrating a conventional protection element illustrated in Patent Document 1.
Figure 19:
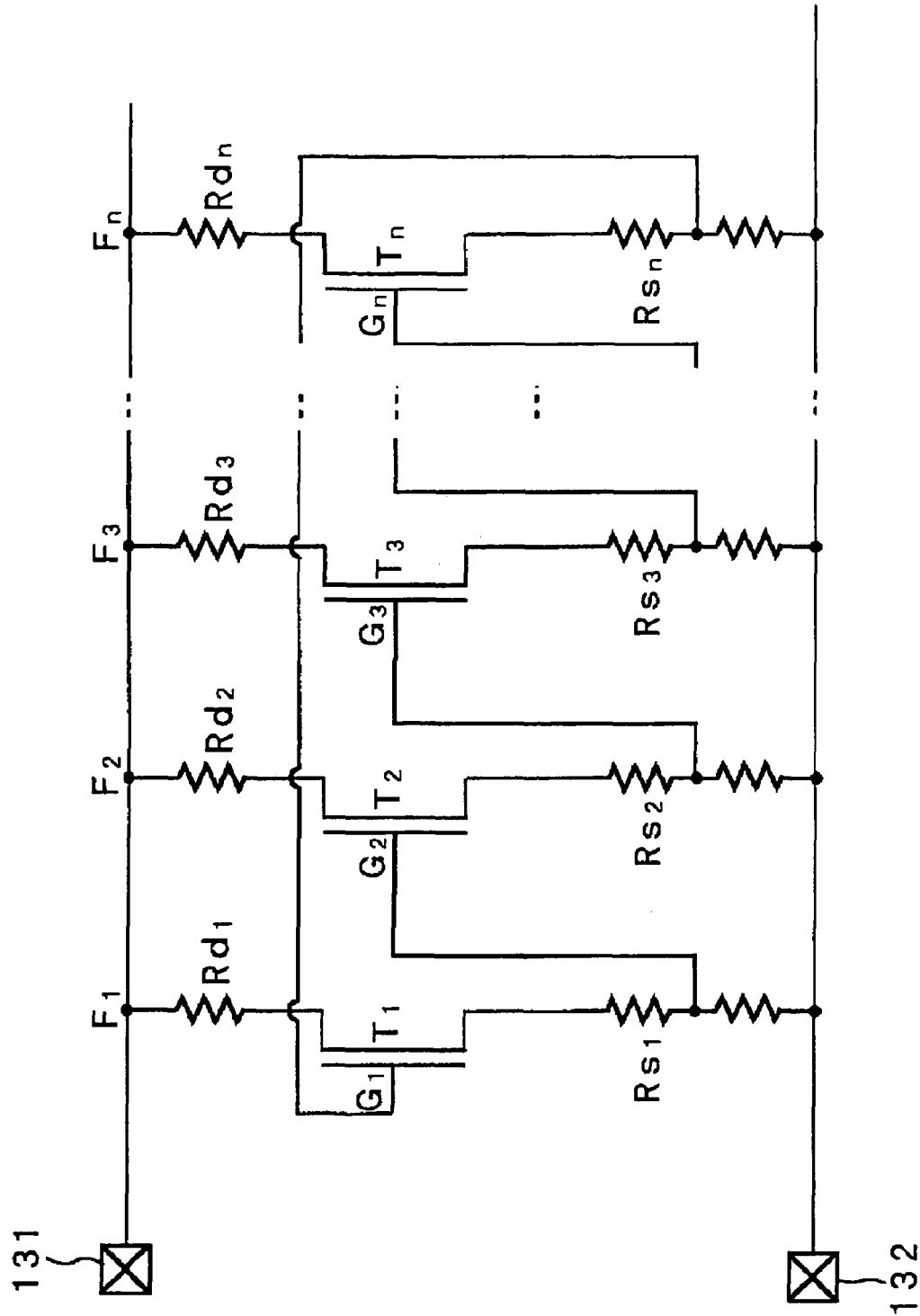
FIG. 19 is an equivalent circuit diagram illustrating a multifinger-type protection element described in Patent Document 2.
Figure 20:
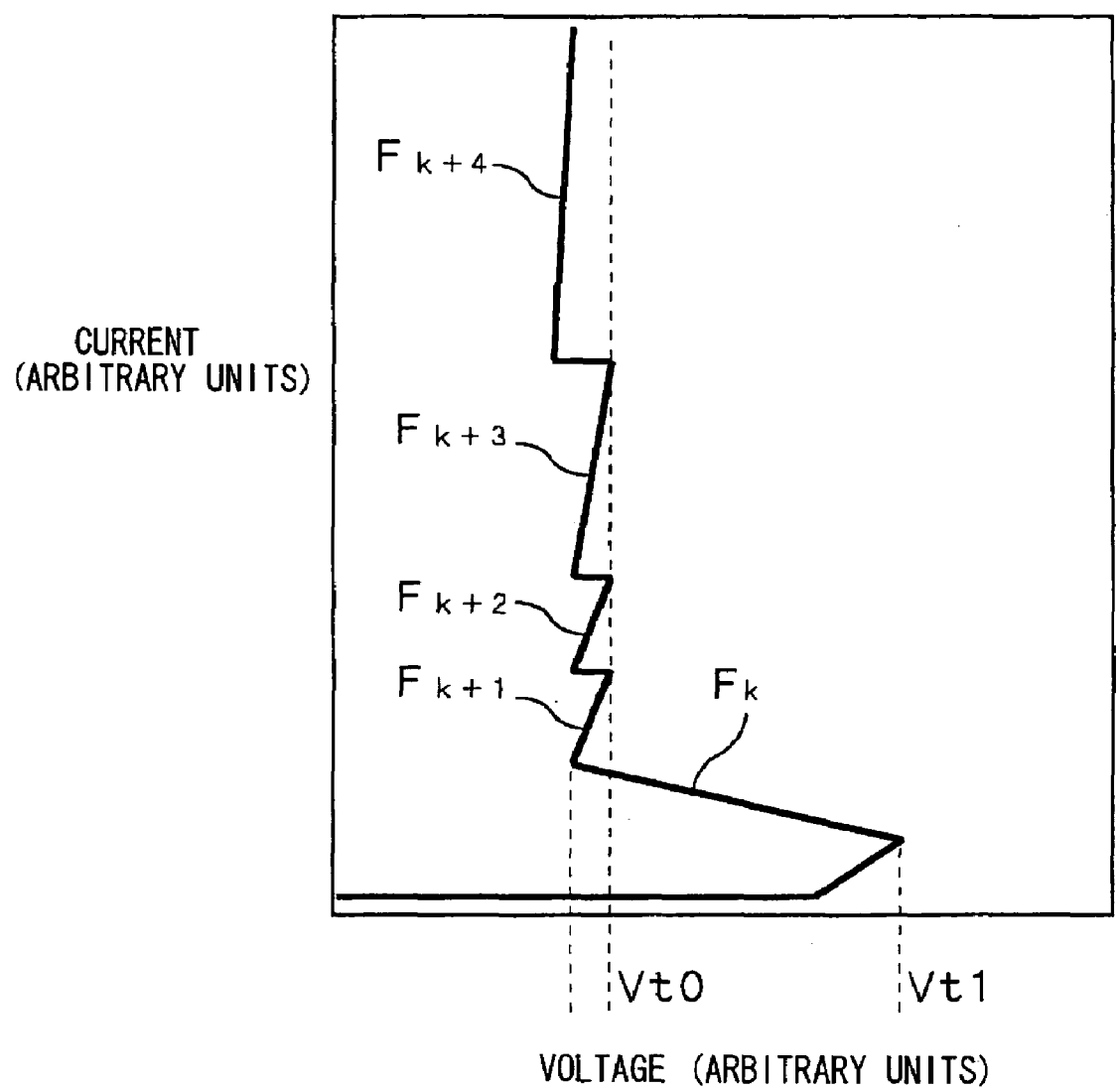
FIG. 20 a graph illustrating the operating characteristic of this MOS-type protection element, in which voltage applied to the protection element is plotted along the horizontal axis and current that flows into the protection element is plotted along the vertical axis.
Figure 21:
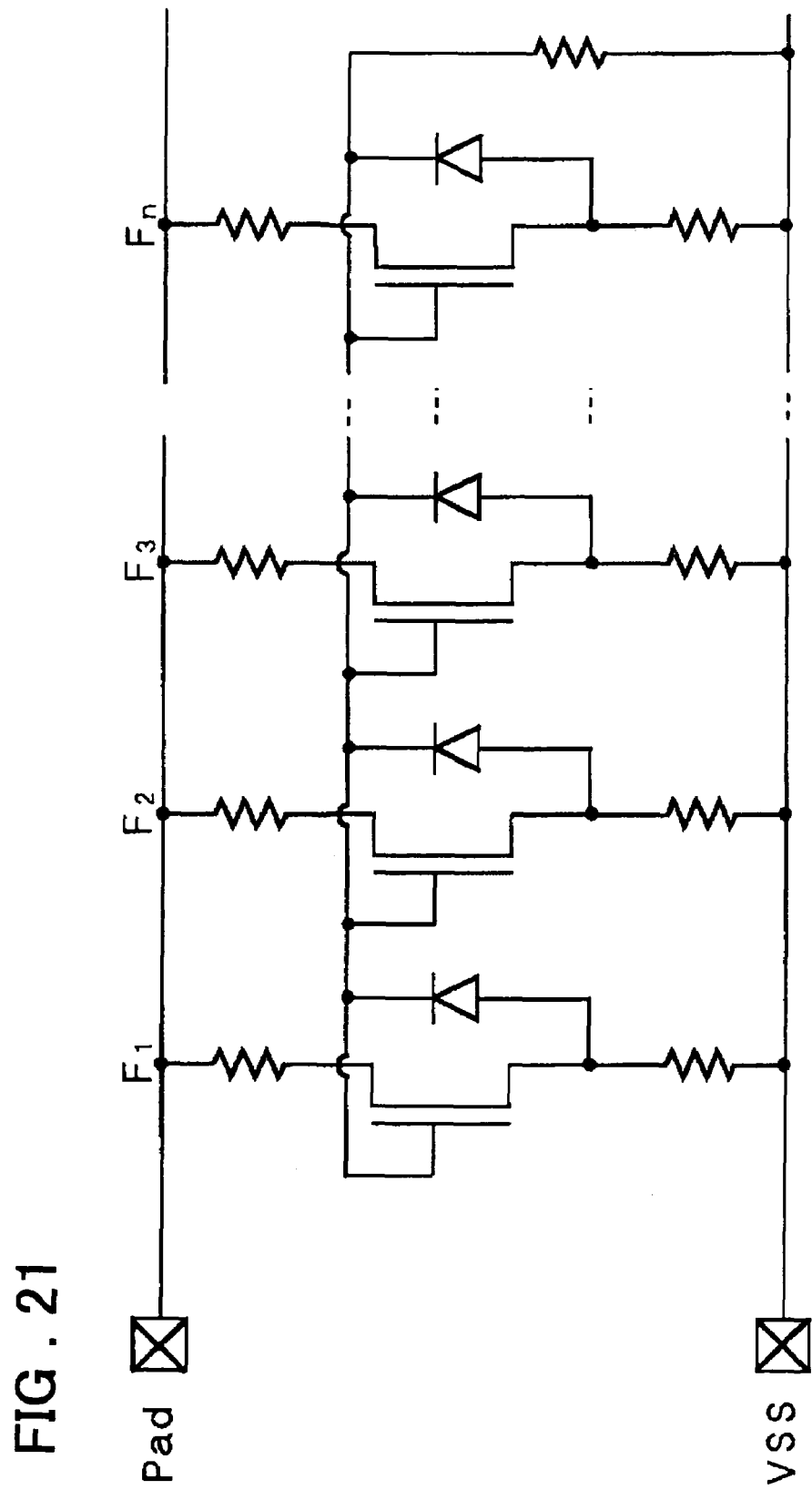
FIG. 21 is a circuit diagram illustrating a conventional protection element in which the gates are connected in common.

A sixth embodiment of the present invention will be described next. FIG. 13 is an equivalent circuit diagram showing an ESD protection element according to this embodiment, and FIG. 14 is a plan view illustrating this ESD protection element. In this ESD protection element, as illustrated in FIG. 13, six fingers $F_1$ to $F_6$, for example, are connected in parallel with one another between an input wiring 13 connected to the input pad 1 to which the surge current is applied and a reference-potential wiring 14 connected to the ground electrode GND. In the fingers $F_1$ to $F_6$, drain resistors $Rd_i$ (i=1 to 6) are connected in parallel with one another and to the input pad 1, and NMOS transistors $T_i$ (i=1 to 6) are connected to respective ones of the drain resistors $Rd_i$. Source resistor $Rs_1$ is connected between source $S_1$ of NMOS transistor $T_1$ and the ground electrode GND, the sources of NMOS transistors $T_2$ and $T_3$ are connected together and form a source $S_{2,3}$ and a source resistor $Rs_{2,3}$ is connected between the source $S_{2,3}$ and the ground electrode GND. Further, the sources of NMOS transistors $T_4$ and $T_5$ are connected together and form a source $S_{4,5}$, and a source resistor $Rs_{4,5}$ is connected between the source $S_{4,5}$ and the ground electrode GND. Furthermore, source resistor $Rs_6$ is connected between source $S_6$ of NMOS transistor $T_6$ and the ground electrode GND.

Further, the gates $G_2$ and $G_3$ of fingers $F_2$ and $F_3$ are connected together and the gates $G_4$ and $G_5$ of fingers $F_4$ and $F_5$ are connected together. The source $S_1$ of finger $F_1$ is connected to gate $G_6$ of finger $F_6$ and to the commonly connected gates $G_2$ and $G_3$ of fingers $F_2$ and $F_3$. Source $S_{2,3}$ of fingers $F_2$ and $F_3$ is connected to gate $G_1$ of finger $F_1$ and to the commonly connected gates $G_4$ and $G_5$ of fingers $F_4$ and $F_5$. Source $S_{4,5}$ of fingers $F_4$ and $F_5$ are connected to the commonly connected gates $G_2$ and $G_3$ of fingers $F_2$ and $F_3$ and to the gate $G_6$ of finger $F_6$. The source $S_6$ of finger $F_6$ is connected to the commonly connected gates $G_4$ and $G_5$ of fingers $F_4$ and $F_5$ and to gate $G_1$ of finger $F_1$.

This embodiment has been described in regard to a case where six is the number of fingers. However, the number of fingers is not limited to six. A more general case where the number of fingers is 2n (where n is a natural number of 2 or greater) will be described below. Fingers $F_1$ to $F_{2n}$ are provided with drain resistors $Rd_1$ to $Rd_{2n}$ and NMOS transistors $T_1$ to $T_{2n}$, respectively. In the fingers at both ends, namely fingers $F_1$ and $F_{2n}$, resistors $Rs_1$ and $Rs_{2n}$ are connected between sources $S_1$ and $S_{2n}$ of the NMOS transistors and the ground electrode GND, respectively. With regard to fingers $F_i$ (i=2 to 2n-1), fingers are formed into pairs, the sources of fingers $F_{2k}$ and $F_{2k+1}$ (k=1 to n-1) are connected together and form a source $S_{2k,2k+1}$ and a source resistor $Rs_{2k,2k+1}$ is connected between the source $S_{2k,2k+1}$ and the ground electrode GND. The source $S_{2k,2k+1}$ is connected to the gates $G_{2k-2}$, $G_{2k-1}$ of the immediately preceding finger pair and to the gates $G_{2k+2}$, $G_{2k+3}$ of the immediately following finger pair. Since the fingers at both ends do not form a pair, the source $S_1$ of finger $F_1$ is connected to the gate $G_6$ of finger $F_6$ and to the commonly connected gates $G_2$ and $G_3$ of fingers $F_2$ and $F_3$, the source $S_{2,3}$ of fingers $F_2$ and $F_3$ is connected to the gate $G_1$ of finger $F_1$ and to the commonly connected gates $G_4$ and $G_5$ of fingers $F_4$ and $F_5$, the source $S_{2n-2,2n-1}$ of fingers $S_{2n-2}$ and $F_{2n-3}$ is connected to the commonly connected gates $G_{2n-4}$ and $G_{2n-3}$ of fingers $F_{2n-4}$ and $F_{2n-3}$ and to the gate $G_{2n}$ of finger $F_{2n}$, and the source $S_{2n}$ of finger $F_{2n}$ is connected to the commonly connected gates $G_{2n-2}$ and $G_{2n-1}$ of fingers $F_{2n-2}$ and $F_{2n-1}$ and to the gate $G_1$ of finger $F_1$.

Further, as shown in FIG. 14, the layout of the ESD protection element according to the sixth embodiment of the present invention differs from that of the ESD protection element of the first embodiment (see FIG. 2) in terms of the structure of the source region. It should be noted that the structure of the drain region is similar to that of the ESD protection element of the first embodiment. More specifically, in this ESD protection element, a P-well (not shown) is formed in the surface of a P-type silicon substrate (not shown), and the n$^+$ region 2 is formed in one direction at, e.g., three locations in the surface of the P-well. The n$^+$ regions 2 at these three locations form common drain regions 3 of respective ones of two mutually adjacent fingers, namely fingers $F_1$ and $F_2$, fingers $F_3$ and $F_4$ and fingers $F_5$ and $F_6$. Further, the plurality of taps 4 are arrayed on one row along the longitudinal direction of the n$^+$ region 2 at the central portion of the n$^+$ region 2 in the lateral direction thereof. The taps 4 are connected to the input pad 1 shown in FIG. 13. Further, the ring-shaped region surrounding the row of taps 4 in the surface of the n$^+$ region 2 constitutes the silicide blocking region 5. Silicide is not formed in this region. On the other hand, silicide (not shown) is formed on the surface of the n$^+$ region 2 in the area other than that occupied by the silicide blocking region 5. The silicide blocking region 5 constructs the drain resistor $Rd_i$ shown in FIG. 13.

Four n$^+$ regions 6 are formed at locations along the lateral direction of the n$^+$ region 2 so as to alternate with the n$^+$ regions 2. The n$^+$ region 6 constitutes the source region 7 in each finger, and the n$_+$ regions 6 correspond to the sources $S_1$, $S_{2,3}$, $S_{4,5}$ and $S_6$ shown in FIG. 13. Further, the region between the n$^+$ region 2 (drain region 3) and n$_+$ region 6 (source region 7) in the surface of the P-well constitutes a channel region (not shown) and is a P-type region. The gate-oxide film (not shown) is provided above the channel region and the gate electrode 9 is provided on the film. The gate electrode 9 corresponds to the gate $G_i$ shown in FIG. 13.

The shape of the n$^+$ region 6 is a rectangle extending in the same direction as the n$^+$ region 2, and a plurality of taps 8 are formed in one row along the longitudinal direction of the n$^+$ region 6 in the central portion of the n$^+$ region 6 laterally thereof. The taps 8 are connected to the ground electrode GND shown in FIG. 13. It should be noted that regions in which taps 8 are not placed exist at both ends and in the central portion of the n$^+$ regions 6 in the longitudinal direction thereof. Contacts 16 are formed in these regions. The contacts 16 are for connecting the sources of a certain finger pair to the gates of the pair of fingers disposed adjacent both sides of the finger pair. For example, a contact 16 formed in the source region 7, which corresponds to source $S_{2,3}$ shown in FIG. 13, is connected to gate $G_1$ and to the gate electrodes 9 corresponding to the commonly connected gates $G_4$ and $G_5$. It should be noted that the resistance of the n$^+$ region 6 between the tap 8 and contact 16 in each source region 7 (the n$^+$ region 6) corresponds to the source resistor $Rs_i$ shown in FIG. 13, and that the size of the source resistor $Rs_i$ is adjusted by the distance between the tap 8 and the contact 16.

In this ESD protection element, as described above, the source region 7 (n$^+$ region 6) of finger $F_1$, the channel region of finger $F_1$, the common drain region 3 (n$^+$ region 2) of fingers $F_1$ and $F_2$, the channel region of finger $F_2$, the common source region 7 (n$^+$ region 6) of fingers $F_2$ and $F_3$, the channel region of finger $F_3$, the common drain region 3 (n$^+$ region 2) of fingers $F_3$ and $F_4$, the channel region of finger $F_4$, the common source region 7 (n$^+$ region 6) of fingers $F_4$ and $F_5$, the channel region of finger $F_5$, the common drain region 3 (n$^+$ region 2) of fingers $F_5$ and $F_6$, the channel region of finger $F_6$ and the source region 7 (n$^+$ region 6) of finger $F_6$ are arrayed in the order mentioned. Further, regions in the surface of the P-well other than the n$^+$ region 2, n$^+$ region 6 and channel region constitute STI regions 10.

Furthermore, multiple interconnection layers (not shown) is provided on the P-type silicon substrate. There are provided within this multiple interconnection layers a wiring connecting the input pad 1 to the taps 4 of the drain region 3 of each finger, a wiring connecting the ground electrode GND to the taps 8 of the source region 7 of each finger and a wiring connecting the contacts 16 of source regions 7 of a certain finger pair to the gate electrodes 9 of a finger pair neighbouring the first-mentioned finger pair. In FIG. 14, wirings connecting the contacts 16 on the illustrated uppermost portion to the gate electrodes 9 is illustrated schematically.

The operation of the ESD protection element according to the sixth embodiment of the present invention constructed as set forth above will be described next. When a surge current is applied to the input pad 1, as shown in FIGS. 13 and 14, a surge voltage is impressed upon fingers $F_1$ to $F_6$. For example, if it is assumed that finger $F_2$ snaps back first, then current will flow into finger $F_2$ and the potential of source $S_{2,3}$ will rise owing to the action of source resistor $Rs_{2,3}$. The rise in the source potential is transferred to gate $G_1$ and to gates $G_4$, $G_5$ via contact 16 provided on source $S_{2,3}$, these gate potentials rise and finger $F_1$ and fingers $F_2$, $F_3$ snap back. Meanwhile owing to the substrate coupling effect, finger $F_3$ having the source $S_{2,3}$ in common with the finger $F_2$ snaps back.

Owing to snapback of finger $F_1$ and fingers $F_4$, $F_5$, the potentials of sources $S_1$ and $S_{4,5}$ rise, the rise in potential is transferred to gates $G_2$, $G_3$ and to gate $G_6$ via the contact 16 and the potentials of gates $G_2$, $G_3$ and gate $G_6$ rise. As a result, the voltage impressed upon the gate-oxide film of gates $G_2$ and $G_3$ is mitigated, current flows uniformly and finger $F_6$ snaps back. Accordingly, all fingers $F_1$ to $F_6$ snap back and the surge current flows to the ground electrode GND through these fingers. Operation is similar also in a case where a finger other than finger $F_2$ snaps back first.

In general, if the gate potential of a transistor is ground potential, snapback of this transistor starts from the end portion of the gate electrode in the width direction. Further, if the gate is in a floating state, snapback of the transistor starts from the central portion of the gate electrode in the width direction. In this embodiment, the contacts 16 are provided at both ends and at the central portion of the source region in the width direction (longitudinal direction). In comparison with the case where the contacts 16 are distributed in the width direction of the source region, the rise in the source potential of the transistor that snapped back can be picked up more rapidly at the beginning of snapback and transferred to the gates of another finger pair. As a result, the time from snapback of a certain finger to snapback of another finger is shortened and, hence, so is the time until a positive potential is applied to the gate of finger that snapped back first. This means that the finger that snapped back first can be protected more reliably.

In this embodiment, source resistor $Rs_i$ is implemented by the resistance of the diffusion layer between tap 8 and contact 16 in each source region 7 ($n^+$ region 6). Accordingly, the source resistor $Rs_i$ can be disposed in the longitudinal direction of the $n^+$ region 6 and the area of the source region can be reduced in comparison with the first embodiment. As a result, the overall layout area of the ESD protection element can be reduced. It should be noted that of the two fingers whose sources are connected together, one finger may serve as a drive element and the other as a protection element. In such case the fingers having the commonly connected sources snap back substantially simultaneously and therefore the drive element that snaps back first can be protected reliably. Effects of this embodiment other than those mentioned above are similar to those of the first embodiment.

Figure 22:
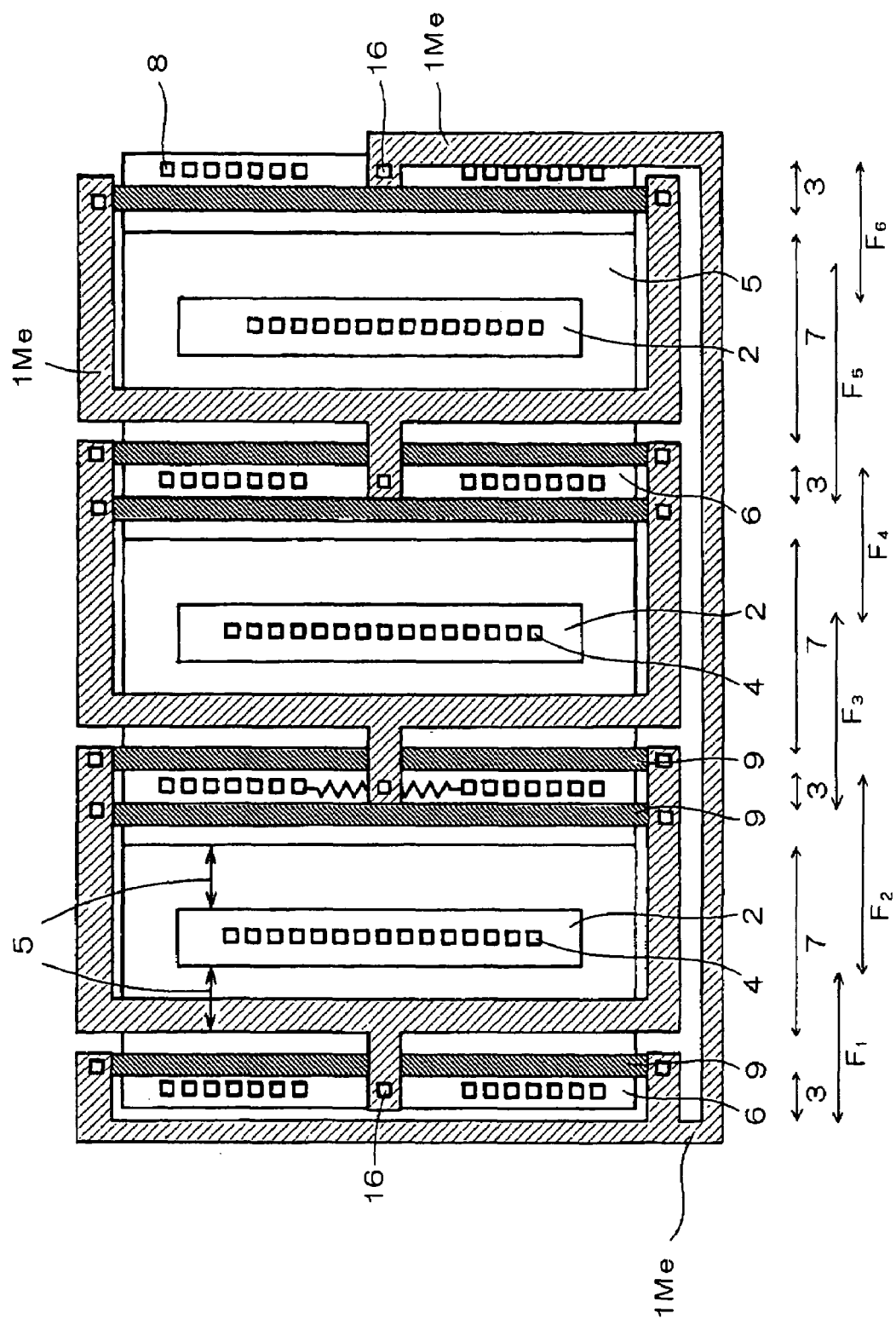
FIG. 22 is a diagram illustrating an example of the layout of an ESD protection element according to a seventh embodiment (a modification of the sixth embodiment) of the present invention.
Figure 23:
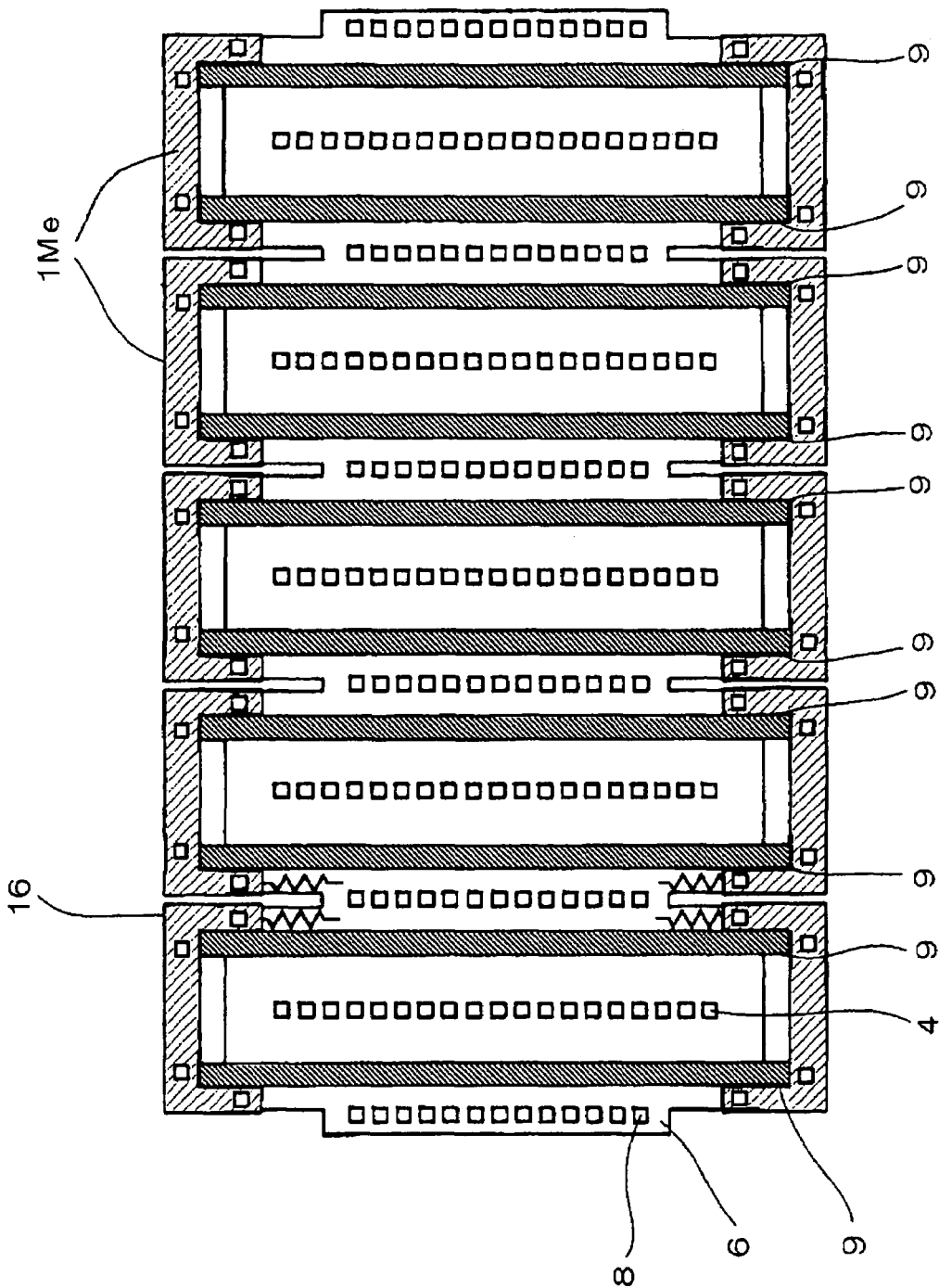
FIG. 23 is a diagram illustrating an example of the layout of an ESD protection element according to an eighth embodiment of the present invention.
Figure 24:
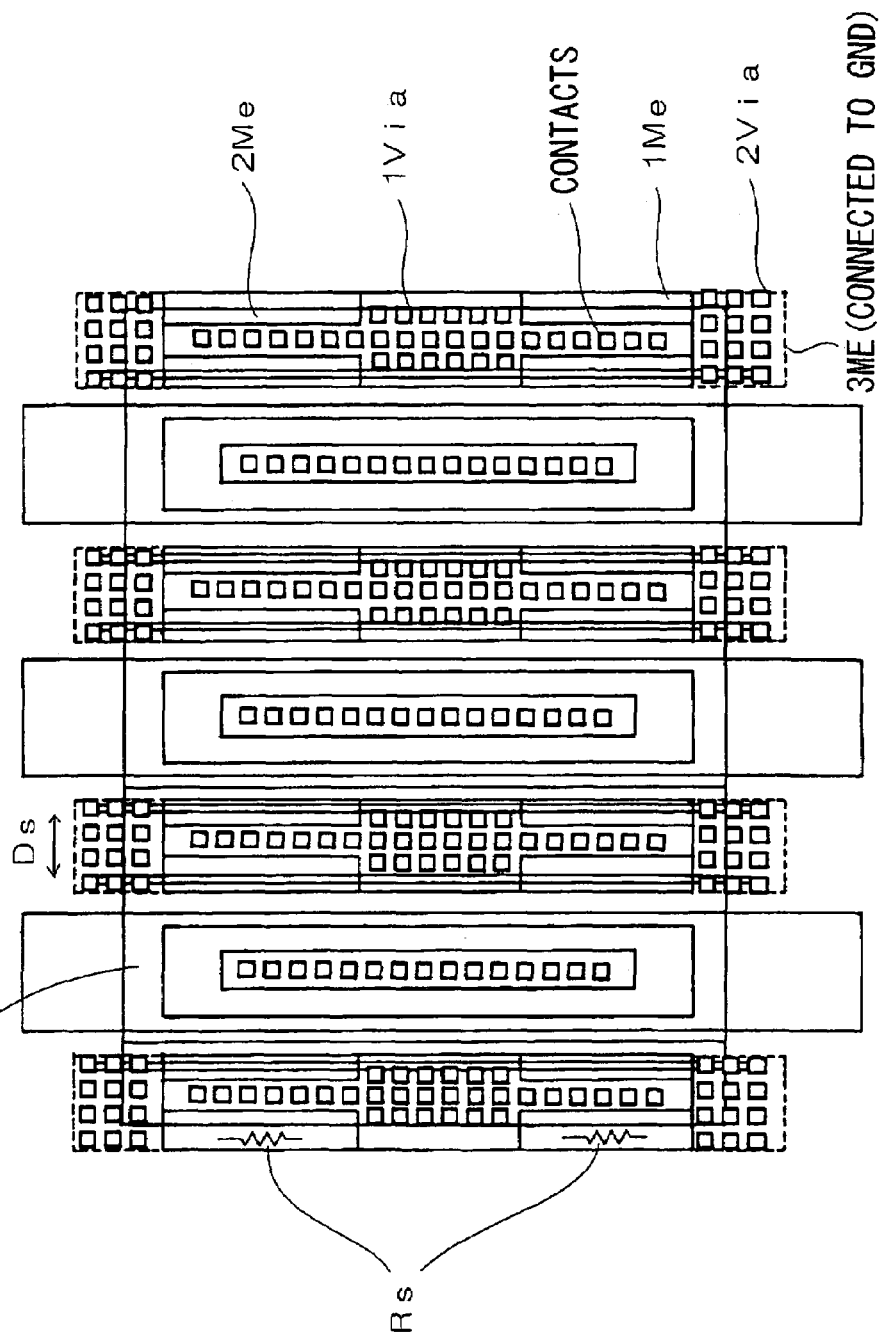
FIG. 24 is a diagram illustrating an example of the layout of the ESD protection element according to the eighth embodiment of the present invention.

FIGS. 22 to 24 are diagrams of layout patterns that are modifications of FIG. 14 and relate to a method of forming the resistor of a source region. The upper-layer wiring is as shown in FIGS. 22, 23 and 24. Interconnections up to the gates of the transistors are not shown in FIG. 24. Though a predriver is not illustrated in FIG. 13, the transistors have their sources connected together and therefore a connection to the predriver may be effected on only one side.

FIG. 22 is a diagram illustrating the underlying structure, in which the arrangement of FIG. 14 is simplified. If the arrangement is such that snapback is transferred bidirectionally, then the arrangement would be as illustrated in FIG. 14. However, the present invention is not limited to the arrangement of FIG. 14. In FIG. 22, the source regions (portions other than those that are split) are connected in common and therefore the so-called substrate coupling effect, in which a rise in potential is readily transferred to the finger the shortest distance away, is achieved. Snapback occurs continuously in the fingers whose sources are connected together.

The operation of the embodiment shown in FIG. 23 will now be described. As shown in FIG. 23, this embodiment is such that the resistance value is raised by splitting the portion used as the resistance element of the source region. This structure is such that by protecting the device's own gate electrode and effecting a connection to one's neighbour (the finger having the commonly connected drain), as in Patent Document 3, snapback is transferred from finger to neighbouring finger in a domino-like fashion. Since the source regions (portions other than the split portions) are common, the substrate coupling effect is achieved and fingers having common sources snap back continuously. In other words, all fingers always turn on because snapback is transferred bidirectionally.

The embodiment of FIG. 24 will be described. In the example illustrated in FIG. 24, the resistance element of the source resistor is formed by a metal interconnection (1METAL) on the source. In the embodiments shown in FIGS. 22 to 24 as well, the source regions are made a common region and the resistance is contrived in each embodiment. In the transistors having the source in common, potential is transferred by the snapback chain in substrate coupling. In the embodiment shown in FIG. 24, potential is transferred via the source resistors (first layer metal interconnect). The resistance element is not limited to an interconnect of a first layer interconnect and up to the upper-layer interconnect may be used. It is also permissible to use gate polycrystalline silicon as the resistance element.

Further, it is permissible to adopt a structure in which the resistance elements are disposed in parallel with the fingers and are placed external to the fingers.

Unlike this embodiment, it is necessary in Patent Document 2 to split the source regions and this is disadvantageous in terms of area. Further, since the sources are partitioned by STI (element isolation), the resistance value is high and the substrate coupling effect is difficult to utilise.

Figure 25:
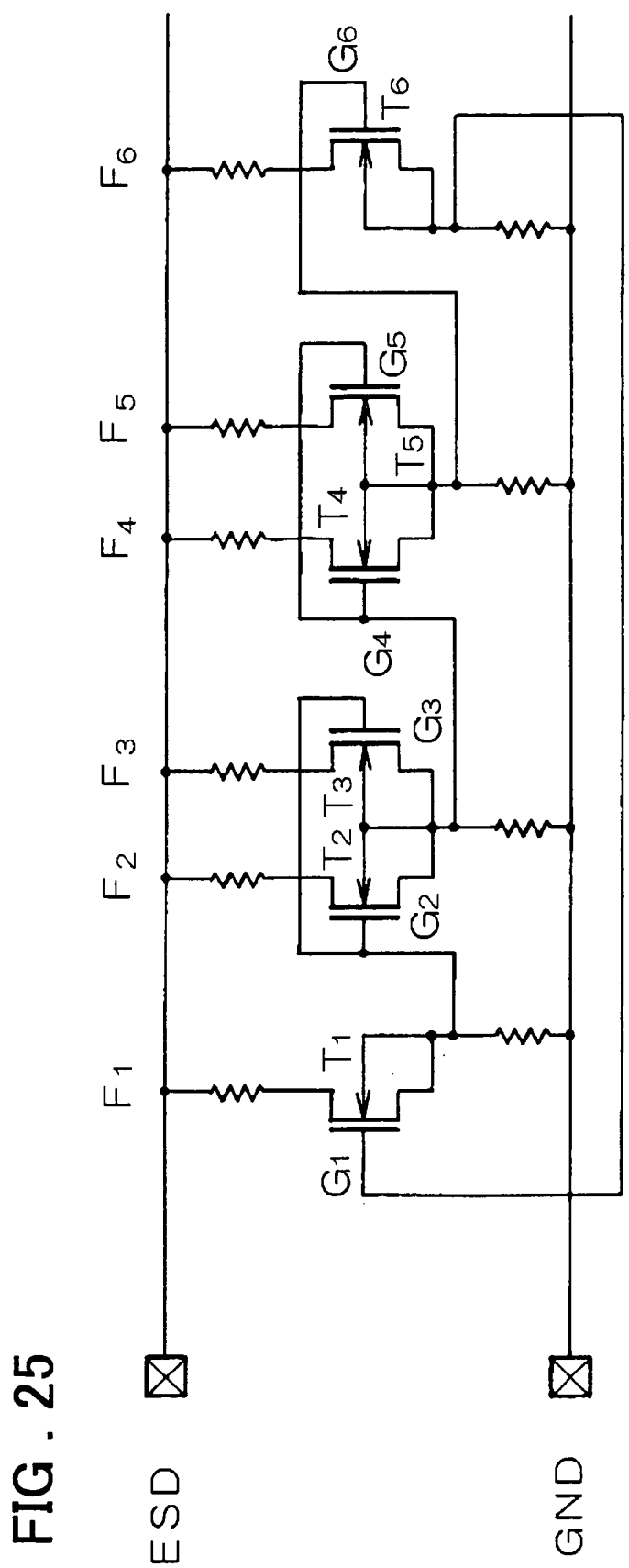
FIG. 25 is a diagram illustrating an example of the layout of an ESD protection element according to a seventh embodiment (a modification of the sixth embodiment) of the present invention.

FIG. 25 is a diagram illustrating the structure of yet another embodiment. This is a modification of the circuit arrangement illustrated in FIG. 13 and the equivalent circuit diagram corresponds to the embodiment depicted in FIG. 24. In the example shown in FIG. 13, the source of MOS transistor $T_1$ of finger $F_1$ in the first stage is connected to gates $G_2$ and $G_3$ of the pair of MOS transistors $T_2$ and $T_3$ of fingers $F_2$ and $F_3$ in which the sources are connected together and to GND via the source resistor, and the drains are connected to ESD (the input pad). The common source of the pair of MOS transistors $T_2$ and $T_3$ of fingers $F_2$ and $F_3$ is connected to the gates $G_4$ and $G_5$ of the pair of MOS transistors $T_4$ and $T_5$ of fingers $F_4$ and $F_5$ in which the sources are connected together and to GND via the source resistor, and the drains are connected to ESD (the input pad). The common source of the pair of MOS transistors $T_4$ and $T_5$ of fingers $F_4$ and $F_5$ is connected to the gate $G_6$ of MOS transistor $T_6$ in the finger $F_6$ of the final stage.

Figure 26:
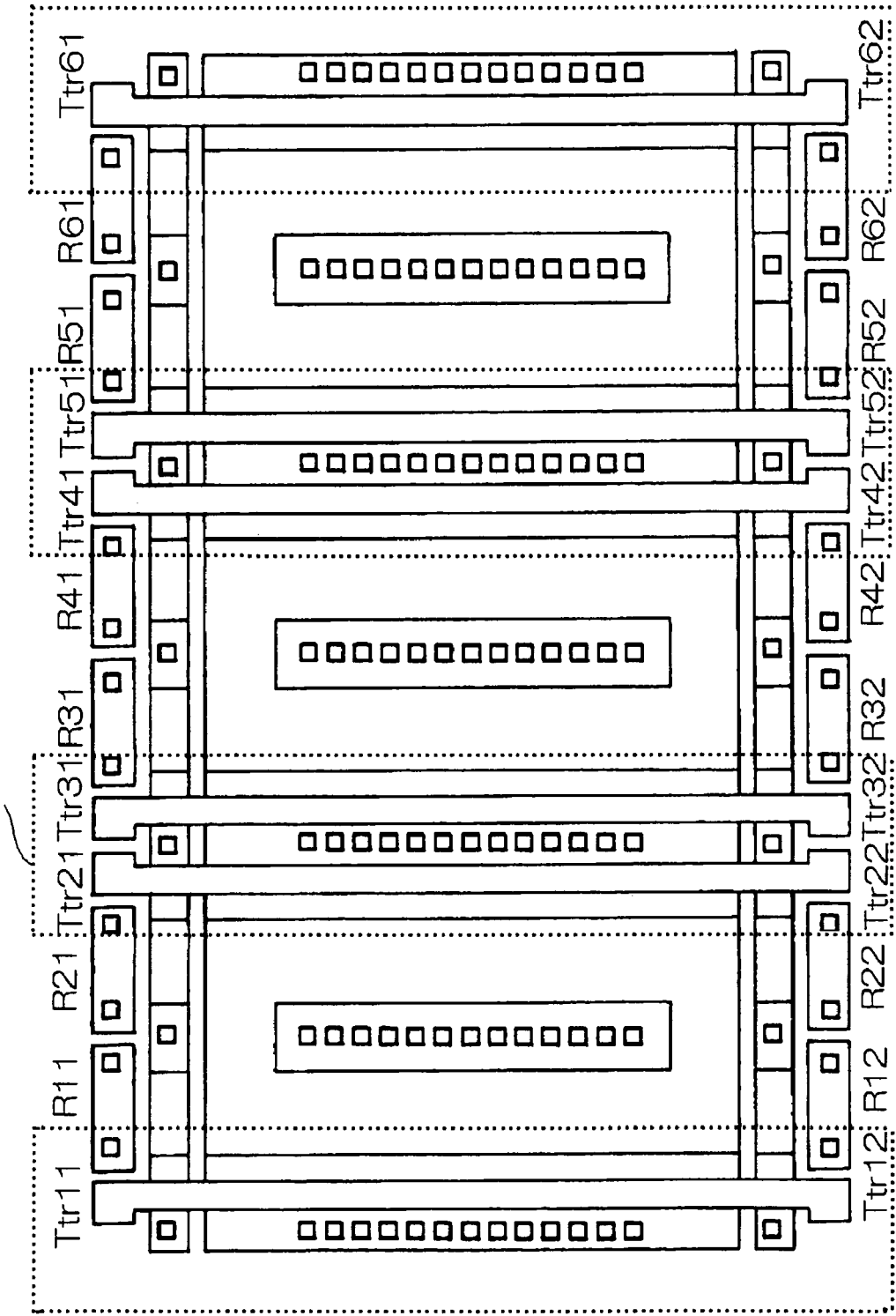
FIG. 26 is a diagram illustrating an example of the layout of an ESD protection element according to a ninth embodiment of the present invention.

FIG. 26 is a diagram illustrating the layout of yet another embodiment of the present invention. In this embodiment, as shown in FIG. 26, small-size transistors Ttr11, Ttr21, Ttr51 and Ttr61 (transistors of small gate width W) are placed on both sides of fingers having a common source, and these are used as trigger elements.

As shown in FIG. 26, the source region is formed so as to surround the P-well. If any finger or trigger element of the protection element snaps back, therefore, the potential of the overall P-well rises, the transistors formed in the same P-well attain the snapback state almost simultaneously and the snapback state is achieved. Consequently, by delivering the potential produced in the source resistor (formed of polycrystalline silicon) of the trigger element to the adjacent gate-electrode pair, all attain the snapback state in domino fashion.

Figure 27:
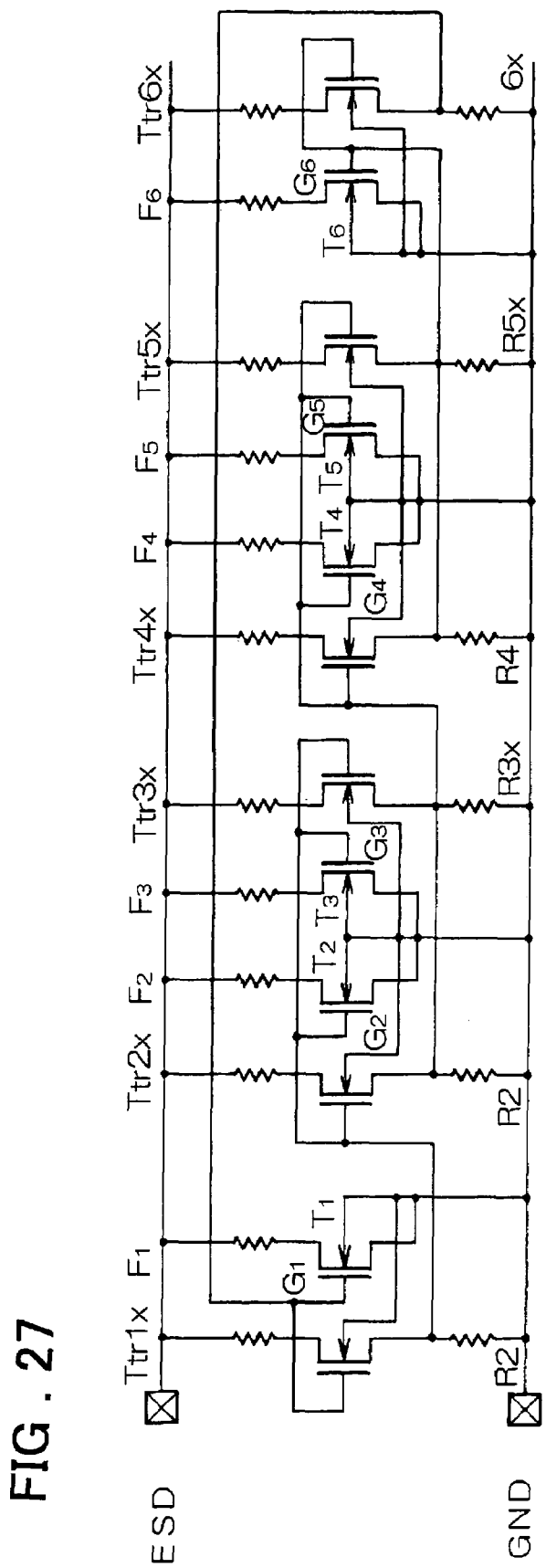
FIG. 27 is an equivalent circuit diagram illustrating an example of an equivalent circuit of an ESD protection element according to the ninth embodiment of the present invention.

FIG. 27 is a diagram illustrating an equivalent circuit having the structure shown in FIGS. 22 and 26. In FIG. 27, the notation of the transistors is made to correspond to that of FIG. 26. However, in consideration of the fact that triggering transistors are included in fingers, it will be understood that FIG. 22 also will have a similar equivalent circuit. This circuit has trigger elements (triggering transistors) Ttr1x, Ttr2x, Ttr3x, Ttr4x, Ttr5x and Ttr6x comprising transistors in which the drains and sources are connected to the input pad (ESD) and ground (GND) via resistors. The gate of transistor Ttrx1 is connected to transistor $T_1$ of finger $F_1$ and to the source of trigger element Ttr6x, and the source of transistor Ttr1x is connected to the gates of transistors $T_2$ and $T_3$ of fingers $F_2$ and $F_3$ in which the gates of the trigger elements Ttr2x and Ttr3x are commonly connected as well as the sources thereof. The source of transistor Ttr2x is connected to the gates of transistors $T_4$ and $T_5$ of fingers $F_4$ and $F_5$ in which the gates of the trigger elements Ttr4x and Ttr5x are commonly connected as well as the sources thereof. The source of transistor Ttr4x is connected to the gate of the transistor of trigger element Ttr6x. The source of transistor Ttr2x is connected to the gates of trigger elements Ttr2x and Ttr3x. The source and back gate of transistor $T_1$ and the back gate of transistor Ttr1x are tied together and connected to GND, the commonly connected sources and back gates of transistors $T_2$ and $T_3$ and the back gates of transistors Ttr2x and Ttr3x are tied together and connected to GND, the commonly connected sources and back gates of transistors $T_4$ and $T_5$ and the back gates of transistors Ttr4x and Ttr5x are tied together and connected to GND, and the source and back gate of transistor $T_6$ and the back gate of transistor Ttr6x are tied together and connected to GND.

Figure 28:
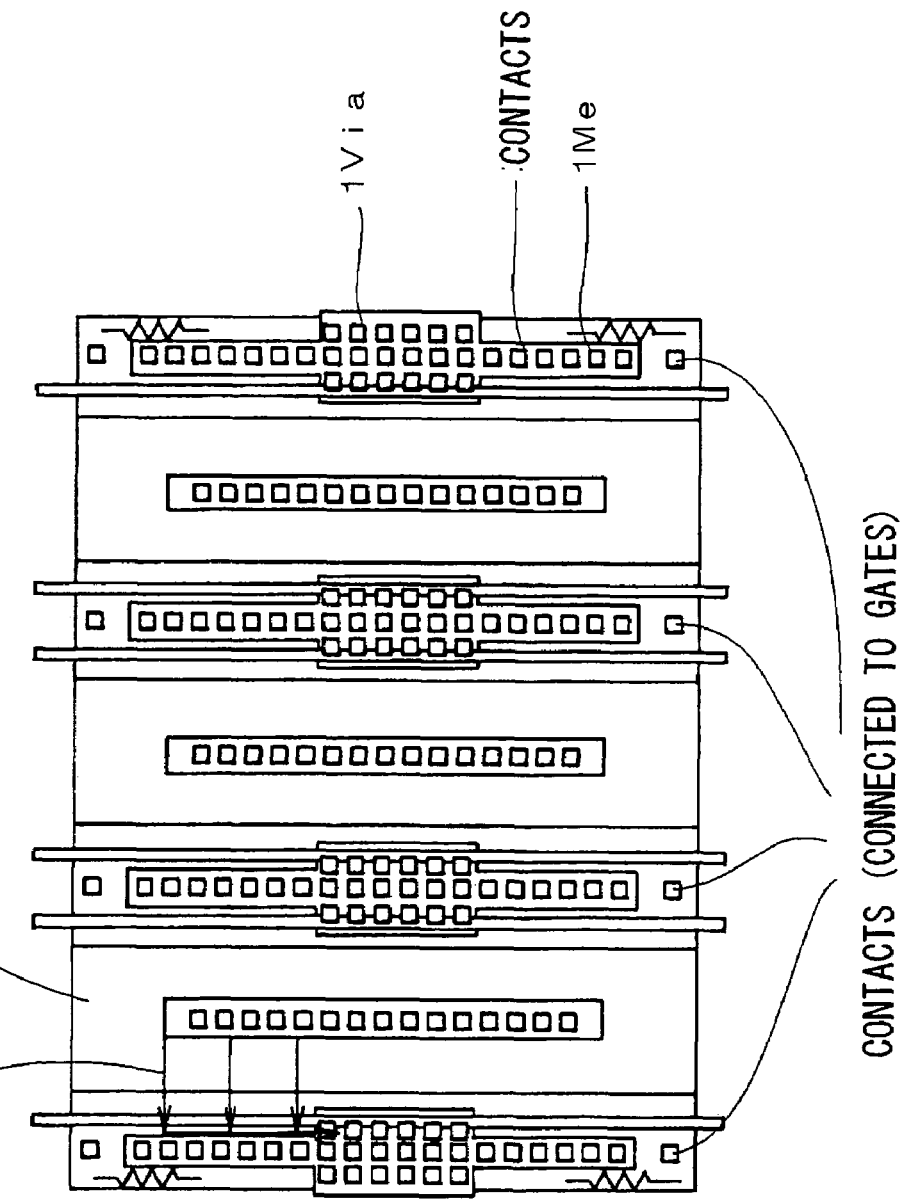
FIG. 28 is a diagram illustrating the layout of the ESD protection element according to the eighth embodiment of the present invention.
Figure 29:
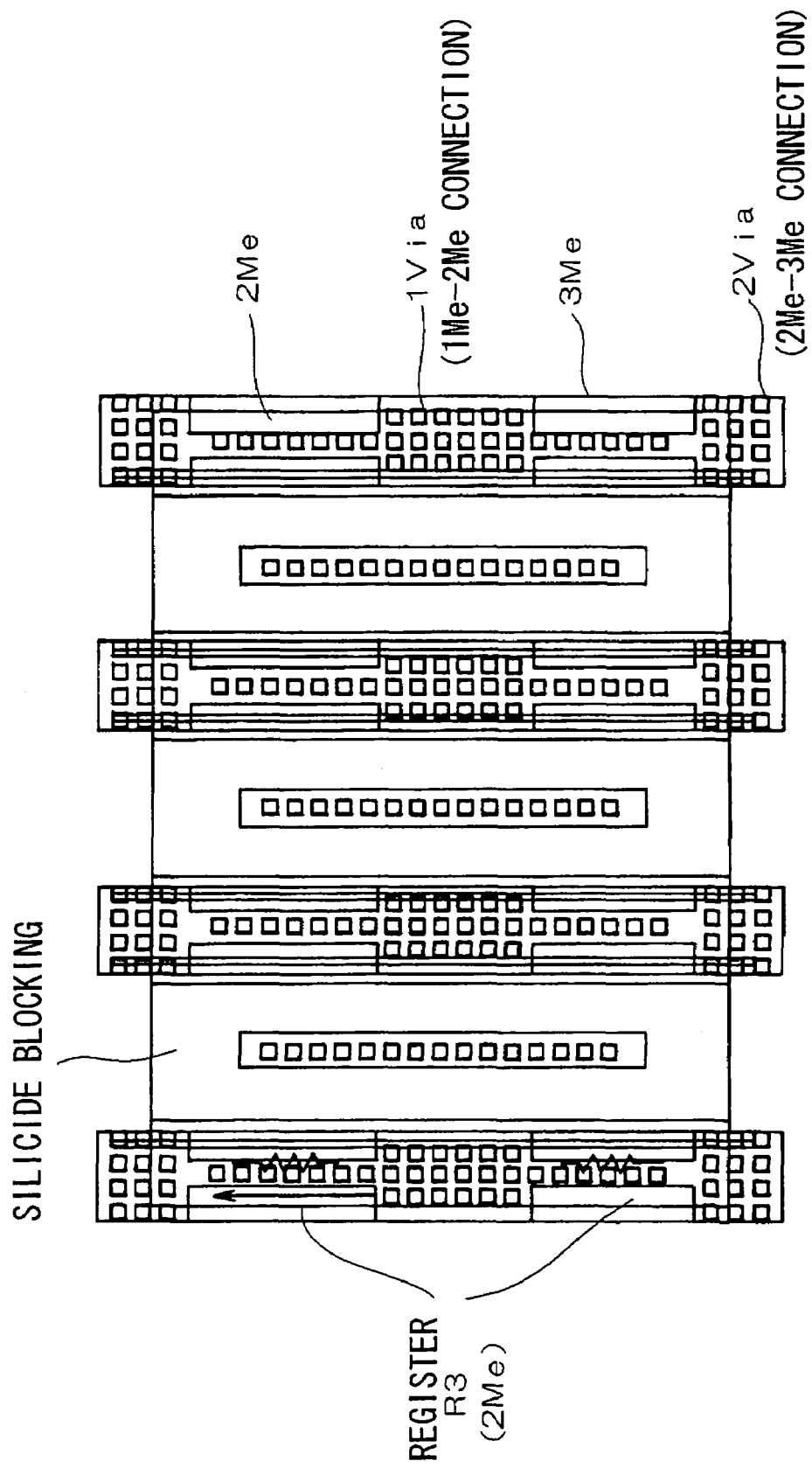
FIG. 29 is a diagram illustrating the layout of the ESD protection element according to the eighth embodiment of the present invention.
Figure 30:
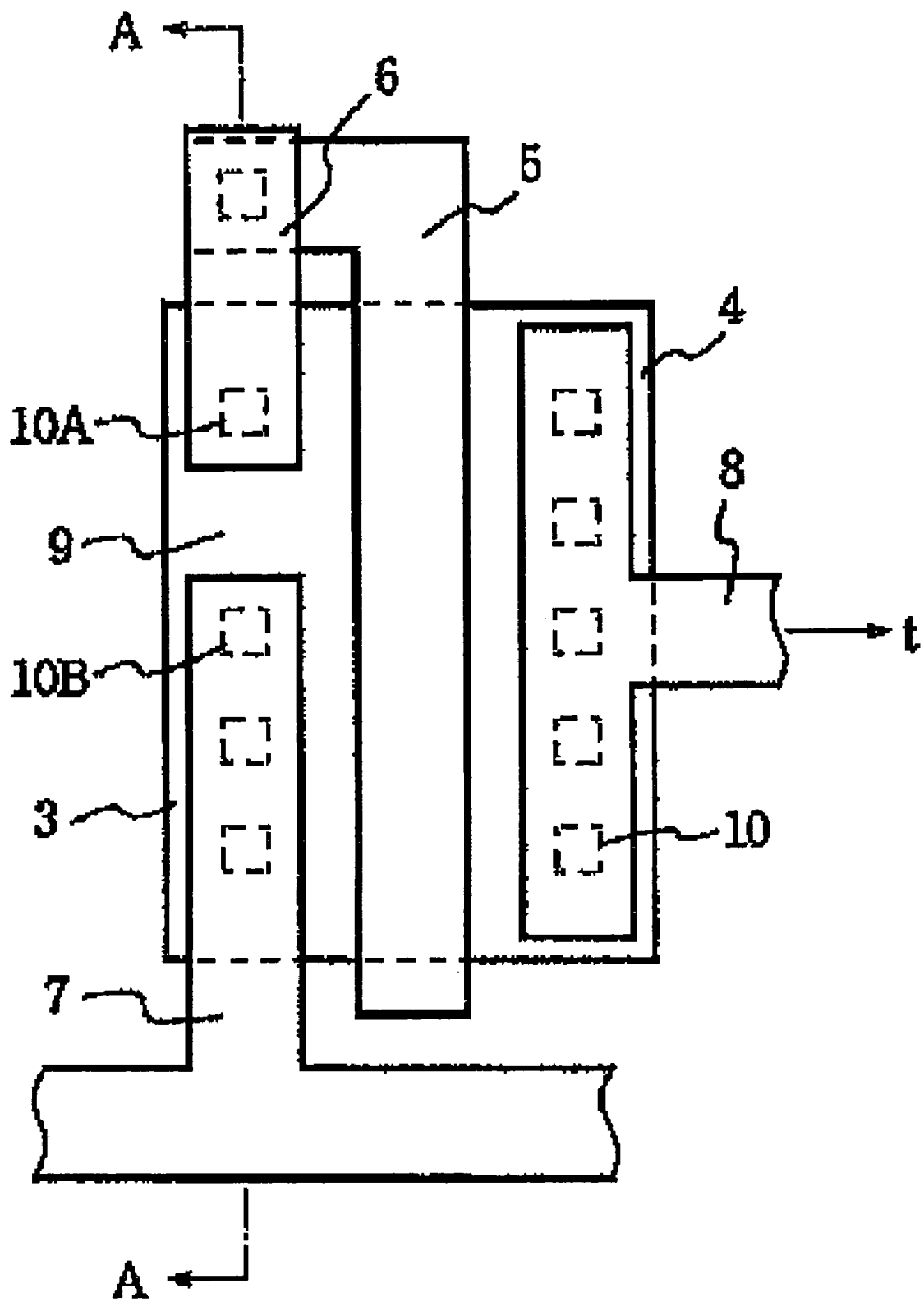
FIG. 30 is a diagram illustrating an arrangement described in Patent Document 3.
Figure 31:
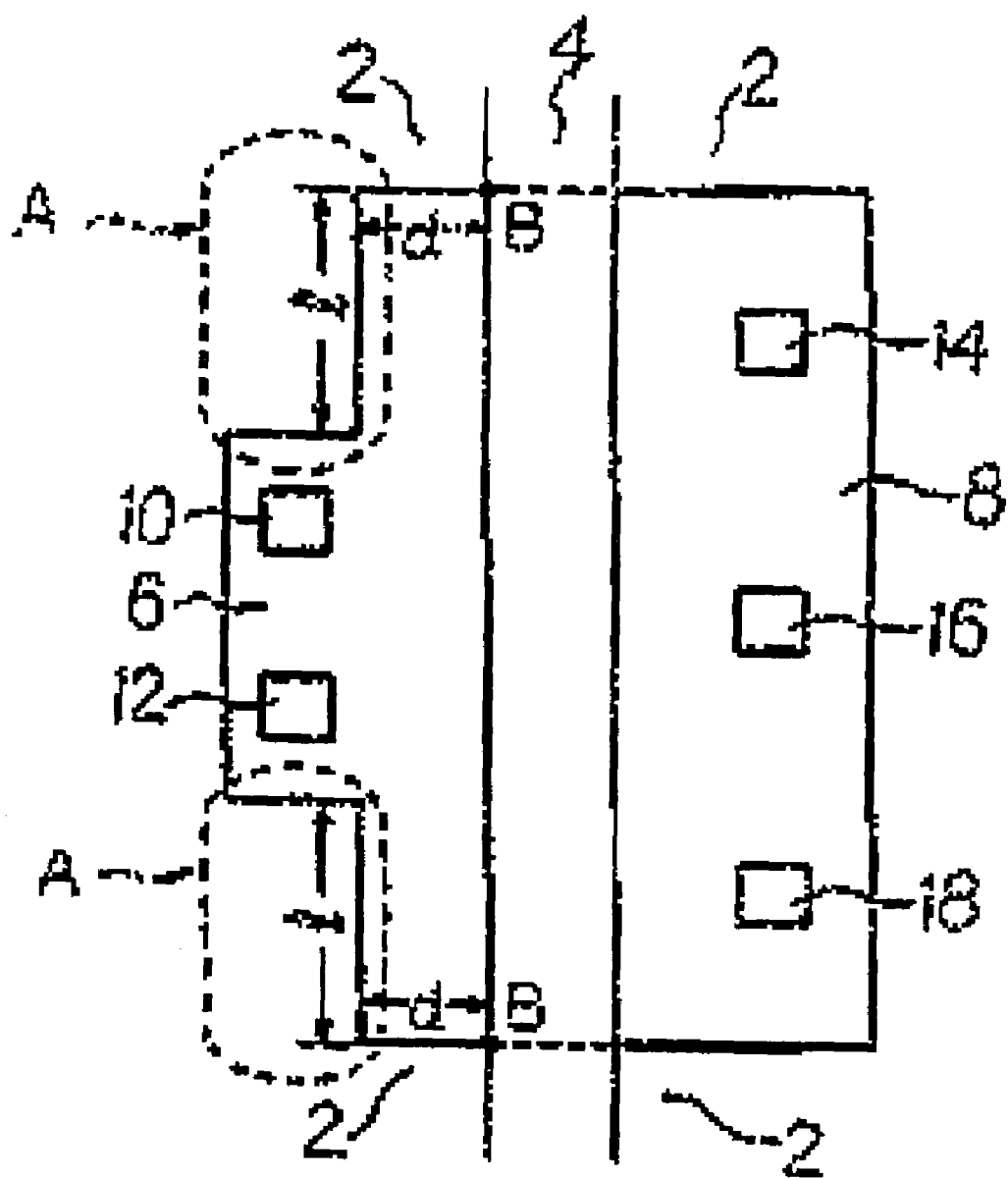
FIG. 31 is a diagram illustrating an arrangement described in Patent Document 4.

FIG. 28 is a diagram illustrating the substrate layout shown in FIG. 24 and the direction of current. FIG. 29 is a diagram illustrating the layout following removal of the first metal layer of FIG. 24.

It should be noted that the present invention covers a method of forming a resistor for raising the potential of each finger of an ESD protection element, the layout, a circuit arrangement for raising this potential and combinations of these. Further, the present invention is not limited to an ESD protection element. For example, the present invention includes a multifinger MOS trigger element used as a trigger circuit for triggering another protection element.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A multifinger element having a plurality of fingers connected in parallel with one another between an input wiring to which a surge current is input and a reference-potential wiring to which a reference potential is applied, wherein
said plurality of fingers are grouped into first to nth (where n represents a natural number of 2 or greater) units of a plurality of fingers;
each finger includes: a transistor having a drain connected to the input wiring; and a source resistor having a first end connected to a source of said transistor and a second end connected to the reference-potential wiring;
the source of said transistor is connected to a gate of a transistor of another finger belonging to the same unit as that of the finger to which the first-mentioned transistor belongs;
sources of at least two transistors belonging to a first unit are connected to respective ones of a source of at least one transistor belonging to a second unit and a source of at least one transistor belonging to the nth unit;
sources of at least two transistors belonging to a kth [where k represents a natural number of 2 to (n−1)] unit are connected to respective ones of a source of at least one transistor belonging to a (k−1)unit and a source of at least one transistor belonging to a (k+1) th unit; and
sources of at least two transistors belonging to the nth unit are connected to respective ones of a source of at least one transistor belonging to the (n−1) th unit and a source of at Least one transistor belonging to the first unit.

2. The element according to claim 1, wherein each unit comprises two of said fingers.

3. The element according to claim 1, wherein one finger in at least one of said units is a drive element in which output of a predriver circuit is applied to the gate of the transistor of this finger.

4. A semiconductor device having a multifinger element as set forth in claim 1.

5. The element according to claim 1, wherein a drain resistor is connected between the input wiring and a drain of each transistor.

6. The element according to claim 5, wherein said transistors are MOS transistors formed in the surface of a semiconductor substrate;
said drains are impurity-doped regions formed in the surface of the semiconductor substrate; and
said drain resistors are resistances of silicide-blocking regions in which no silicide layer has been formed on the surface of the impurity-doped region.

7. The element according to claim 1, wherein said transistors are MOS transistors formed in the surface of a semiconductor substrate.

8. The element according to claim 7, wherein the source of each transistor is connected to a channel region of the transistor via a substrate resistance.

9. The element according to claim 7, wherein the source of each transistor is connected to a channel region of another transistor different from this transistor via a substrate resistance.

10. The element according to claim 7, wherein said source comprises an impurity-doped region formed in the surface of the semiconductor substrate;
a plurality of contacts and a plurality of taps are formed in the surface of the impurity-doped region, said contacts being formed in the surface at both ends and at a central portion in a direction along which a boundary line of the impurity-doped region and a channel region extends and being connected to the gates of transistors of fingers that are different from the finger to which this source belongs, and said taps being disposed spaced away from said contacts in the direction along which the boundary line extends and being connected to the reference-potential wiring; and
said source resistor is resistance of a portion of said impurity-doped region between said contact and said tap.

11. The element according to claim 7, wherein said source comprises an impurity-doped region formed in the surface of the semiconductor substrate; and
said source resistor is resistance of a third portion of said impurity-doped region between a first portion connected to the reference-potential wiring and a second portion connected to the channel region.

12. The element according to claim 11, wherein length of said third portion perpendicular to a direction from said first portion to said second portion is smaller than length of said first portion and length of said second portion in this direction.

13. A multifinger element having a plurality of fingers connected in parallel with one another between an input wiring to which a surge current is input and a reference-potential wiring to which a reference potential is applied, wherein
each finger includes: a transistor having a drain connected to the input wiring; and a source resistor having a first end connected to the source of said transistor and a second end connected to the reference-potential wiring;
the source of said transistor is coupled with at least two gates of transistors belonging to said plurality of fingers.

* * * * *